(12) United States Patent
Chang

(10) Patent No.: US 12,237,303 B2
(45) Date of Patent: Feb. 25, 2025

(54) VERTICALLY MOUNTED DIE GROUPS

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 18/587,908

(22) Filed: Feb. 26, 2024

(65) Prior Publication Data

US 2024/0194644 A1    Jun. 13, 2024

Related U.S. Application Data

(63) Continuation of application No. 17/534,395, filed on Nov. 23, 2021, now Pat. No. 11,929,348.

(60) Provisional application No. 63/186,043, filed on May 7, 2021.

(51) Int. Cl.
*H01L 25/065* (2023.01)
*H01L 23/00* (2006.01)
*H01L 25/00* (2006.01)

(52) U.S. Cl.
CPC .......... *H01L 25/0652* (2013.01); *H01L 24/05* (2013.01); *H01L 24/08* (2013.01); *H01L 24/80* (2013.01); *H01L 25/50* (2013.01); *H01L 2224/05647* (2013.01); *H01L 2224/08145* (2013.01); *H01L 2224/80895* (2013.01); *H01L 2224/80896* (2013.01); *H01L 2225/06555* (2013.01)

(58) Field of Classification Search
None
See application file for complete search history.

(56) References Cited

U.S. PATENT DOCUMENTS

2022/0320046 A1   10/2022  Chang
2022/0352092 A1   11/2022  Chang

*Primary Examiner* — Telly D Green
(74) *Attorney, Agent, or Firm* — Kilpatrick Townsend & Stockton LLP

(57) ABSTRACT

A semiconductor package includes: a base substrate structure; and a plurality of die groups disposed on a top surface of the based substrate structure, the plurality of die groups comprising a first die group and a second die group neighboring to each other. The first die group includes a plurality of first dies stacked parallel to each other and parallel to a front surface of the first die group, the front surface of the first die group and the top surface intersect at a first edge extending in a first direction. The second die group includes a plurality of second dies stacked parallel to each other and parallel to a front surface of the second die group, the front surface of the second die group and the top surface intersect at a second edge extending in a second direction not parallel to the first direction.

20 Claims, 12 Drawing Sheets

VERTICALLY MOUNTED DIE GROUPS

CROSS-REFERENCES TO RELATED APPLICATIONS

The application is a continuation application of U.S. patent application Ser. No. 17/534,395, filed Nov. 23, 2021, which claims priority to U.S. Provisional Patent Application 63/186,043, filed on May 7, 2021, and entitled "Vertical Small Outline Integrated Circuit Stress Release by Lattice Shift," the entire disclosure of which is incorporated herein by reference.

TECHNICAL FIELD

The present disclosure relates to stacked die assemblies, and more particularly to multi-die structures with vertically arranged die groups.

BACKGROUND

Semiconductor dies can be electrically connected with other circuitry in a package substrate. The package substrate provides for electrical connection to other circuitry on a printed circuit board. Semiconductor dies can have different functions and are difficult to be processed using the same semiconductor processing techniques, so they are manufactured separately. A large multi-functional device having high performance can be obtained by assembling multiple dies into the device. However, the semiconductor dies may have different coefficients of thermal expansion that can result in delamination, dishing on bonding pads, and deformation and warpage in the package substrate.

BRIEF DESCRIPTION OF THE DRAWINGS

The present disclosure is best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
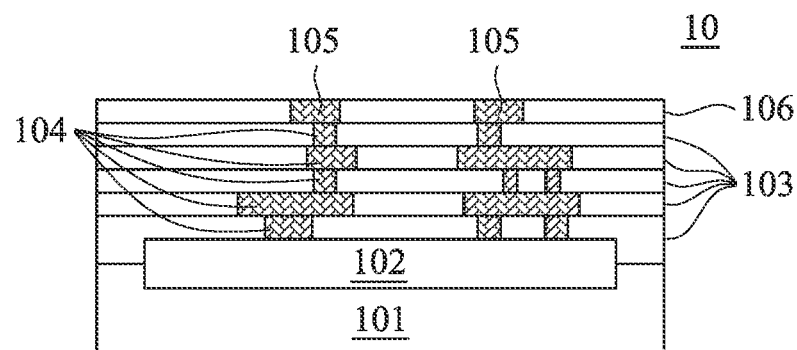
FIG. 1 is a cross-sectional view of a structure of a semiconductor device, in accordance with some embodiments.

The following disclosure provides different embodiments or examples for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Prepositions, such as "on" and "side" (as in "sidewall") are defined with respect to the conventional plane or surface being on the top surface of the wafer or substrate, regardless of the orientation of the wafer or substrate. The term "horizontal" is defined as a plane parallel to the conventional plane or surface of a wafer or substrate, regardless of the orientation of the wafer or substrate. The term "vertical" refers to a direction perpendicular to the horizontal as defined above, i.e., perpendicular to the surface of a substrate. The terms "first," "second," "third," and "fourth" may be used herein to describe various elements, components, regions, layers and/or sections; these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

There are many packaging technologies to house the semiconductors such as the 2D fan-out (chip-first) IC integration, 2D flip chip IC integration, PoP (package-on-package), SiP (system-in-package) or heterogeneous integration, 2D fan-out (chip-last) IC integration, 2.1D flip chip IC integration, 2.1D flip chip IC integration with bridges, 2.1D fan-out IC integration with bridges, 2.3D fan-out (chip-first) IC integration, 2.3D flip chip IC integration, 2.3D fan-out (chip-last) IC integration, 2.5D (solder bump) IC integration, 2.5D (μbump) IC integration, μbump 3D IC integration, μbump chiplets 3D IC integration, bumpless 3D IC integration, bumpless chiplets 3D IC integration, SoIC and/or any other packaging technologies. It should be understood that, although various embodiments disclosed herein are described and illustrated in a context of a specific semiconductor packaging technology, it is not intended to limit the present disclosure only to that packaging technology. One skilled in the art would understand those embodiments may be applied in other semiconductor technologies in accordance with principles, concepts, motivations, and/or insights provided by the present disclosure.

System on integrated chip (SoIC) is a recent development in advanced packaging technologies. SoIC technology integrates both homogeneous and heterogeneous chiplets into a single System-on-Chip (SoC)-like chip with a smaller footprint and thinner profile, which can be holistically integrated into advanced WLSI (aka CoWoS® service and InFO). From external appearance, the newly integrated chip is just like a general SoC chip yet embedded with desired and heterogeneously integrated functionalities. SoIC realizes 3D chiplets integration with additional advantages in performance, power and form factor. Among many other features, the SoIC™ features ultra-high-density-vertical stacking for high performance, low power, and min RLC (resistance-inductance-capacitance). SoIC integrates active and passive chips into a new integrated-SoC system to achieve better form factor and performance. US Patent Publication #20200168527, entitled "SoIC chip architecture," provides some descriptions about some example SoIC structures. US Patent Publication #20200168527 is incorporated by reference in its entirety. Another example of SoIC™ can be found at https://3dfabric.tsmc.com/english/dedicatedFoundry/technology/SoIC.htm, which is also incorporated by reference in the present disclosure in its entirety.

Numerous benefits and advantages are achieved by way of the present disclosure over conventional techniques. For example, embodiments provide a three-dimensional (3D) functional block die stacking solution to enhance high system integration and performance. In those embodiments, multiple functional stacked die devices, having the same or different functionalities, are grouped together as a die group. In those embodiments, multiples of such a die group are arranged in a multi-die structure in a manner such that stresses in a substrate of the multi-die structure are eliminated or reduced. Arrangements of die groups in a multi-die structure can prevent die breaking, die cracking, warpage of the substrate, and/or achieve any other benefits. These and other embodiments of the disclosure, along with many of its advantages and features, are described in more detail in conjunction with the text below and corresponding figures.

Exemplary embodiments described herein relate to multi-chip devices having vertically stacked chips mounted on a base substrate. As used herein, chips and dies are used interchangeably and refer to pieces of a semiconductor wafer, to which a semiconductor manufacturing process has been performed, formed by separating the semiconductor wafer into individual dies. A chip or die can include a processed semiconductor circuit having a same hardware layout or different hardware layouts, or same functions or different functions. In general, a chip or dies has a substrate, a plurality of metal lines, a plurality of dielectric layers interposed between the metal lines, a plurality of vias electrically connecting the metal lines, and active and/or passive devices. The dies can be assembled together to be a multi-chip device or a die group. As used herein, a chip or die can also refer to an integrated circuit including a circuit configured to process and/or store data. Examples of a chip, die, or integrated circuit include a field programmable gate array (e.g., FPGA), a processing unit, e.g., a graphics processing unit (GPU) or a central processing unit (CPU), an application specific integrated circuit (ASIC), memory devices (e.g., memory controller, memory), and the like.

Dies and Die Groups in Accordance with the Present Disclosure

In this section, an example individual die structure, an example stacked die structure in a die group, and an example wafer-on-wafer configuration having the example stacked die structure are provided to illustrate some embodiments where the present disclosure may be applied. It should be understood that the examples shown in this section are merely illustrative for understanding how the present disclosure may be applied in those examples. Thus, these examples should not be construed as being intended to limit the present disclosure. One skilled in the art will understand the present disclosure may be applied in other semiconductor packaging technologies wherever appropriate.

An Example Individual Die Structure in Accordance with the Present Disclosure

FIG. 1 is a cross-sectional view of a structure of a semiconductor device, in accordance with some embodiments. One or more of such a semiconductor device may be arranged on an individual die in a die group in various embodiments. Referring to FIG. 1, the semiconductor device 10 includes a substrate 101, an active region 102 formed on a surface of the substrate 101, a plurality of dielectric layers 103, a plurality of metal lines and a plurality of vias 104 formed in the dielectric layers 103, and a metal structure 105 in a top inter-metal layer 106. In an embodiment, the semiconductor device 10 also includes passive devices, such as resistors, capacitors, inductors, and the like. The substrate 101 can be a semiconductor substrate or a non-semiconductor substrate. For example, the substrate 101 may include a bulk silicon substrate. In some embodiments, the substrate 101 may include an elementary semiconductor, such as silicon or germanium in a crystalline structure; a compound semiconductor, e.g., silicon germanium; silicon carbide, gallium arsenic, gallium phosphide, indium phosphide, indium arsenide, and/or indium antimonide; or combinations thereof. Possible substrate 101 may also include a semiconductor-on-insulator (SOI) substrate. In an embodiment, the substrate 101 is a silicon layer of an SOI substrate. The substrate 101 can include various doped regions depending on design requirements, e.g., n-type wells or p-type wells. The doped regions are doped with p-type dopants, e.g., boron, n-type dopants, e.g., phosphorous or arsenic, or combination thereof. The active region 102 may include transistors. The dielectric layers 103 may include interlayer dielectric (ILD) and inter-metal dielectric (IMD) layers. The ILD and IMD layers may be low-k dielectric layers which have dielectric constants (k values) smaller than a predetermined value, e.g., about 3.9; smaller than about 3.0, smaller than about 2.5 in some embodiments. In some other embodiments, the dielectric layers 103 may include non-low-k dielectric materials having dielectric constants equal to or greater than 3.9. The metal lines and vias may include copper, aluminum, nickel, tungsten, or alloys thereof.

An Example Stacked Die Structure in Accordance with the Present Disclosure

Figure 2:
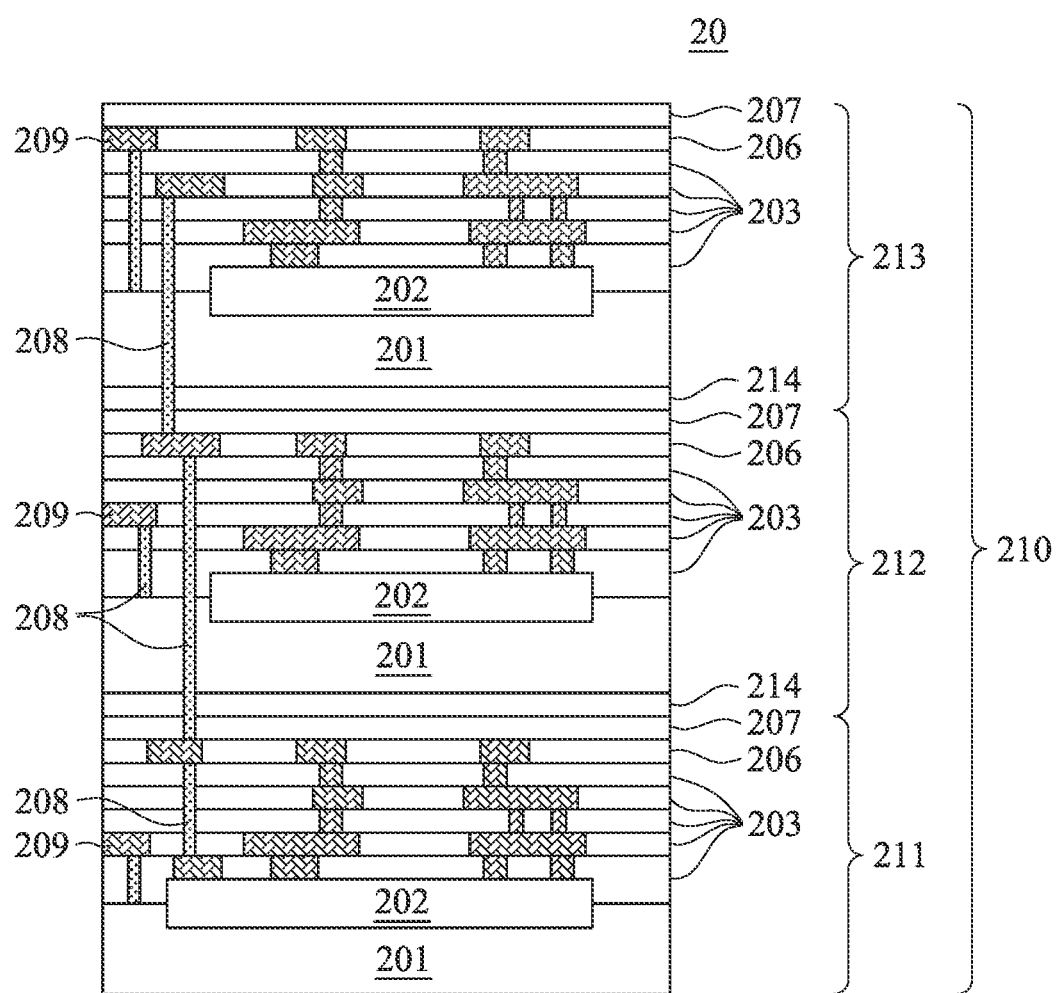
FIG. 2 is a cross-sectional view of a die group having a plurality of dies stacked on top of each other, in accordance with some embodiments.

FIG. 2 is a cross-sectional view of a die group 20 having a plurality of dies stacked on top of each other horizontally according to some embodiments. Referring to FIG. 2, the die group 20 includes a stacked die structure 210 including a plurality of dies 211, 212, and 213 stacked on top of each other in a substantially horizontal arrangement. As shown, in this example, each of the dies 211, 212, and 213 in the die group includes a semiconductor device similar to the semiconductor device 10 described and illustrated in connection with FIG. 1. It should be understood although 3 dies are shown to be in the stacked die structure 210, this is not intended to be limiting. One of skill in the art will understand that a stacked die structure in accordance with the present disclosure can include a greater or smaller number of dies than those shown in FIG. 2.

As can be seen, in this example, the stacked dies in the stacked die structure 210 are bonded to each other through bonding members 214. In some implementations, the bonding members 214 include hybrid bonding films. However, this is not intended to be limiting. It is understood that the bonding members 214 in accordance with the present disclosure are not limited to hybrid bonding films. For example, it is contemplated that the bonding members 214 may include micro bumps, solder balls, metal pads, and/or any other suitable bonding structures.

As also can be seen, each of the stacked dies 211, 212, and 213 includes a substrate 201, an active region 202 formed on a surface of the substrate 201, a plurality of dielectric layers 203, a plurality of metal lines and a plurality of vias 204 formed in the dielectric layers 203, and a passivation layer 207 on a top inter-metal layer 206. In an embodiment, a stacked die can also include passive devices, such as resistors, capacitors, inductors, and the like. The substrate 201 can be a semiconductor substrate or a non-semiconductor substrate. For example, the substrate 201 may include a bulk silicon substrate. In some embodiments, the substrate 201 may include an elementary semiconductor, such as silicon or germanium in a crystalline structure; a compound semiconductor, e.g., silicon germanium, silicon carbide, gallium arsenide, gallium phosphide, indium phosphide, indium arsenide; or combinations thereof. Possible substrate 201 may also include a semiconductor-on-insulator (SOI) substrate. In an embodiment, the substrate 201 is a silicon layer of an SOI substrate. The substrate 201 can include various doped regions depending on design requirements, e.g., n-type wells or p-type wells. The doped regions are doped with p-type dopants, e.g., boron, n-type dopants, e.g., phosphorous or arsenic, or combination thereof. The active region 102 may include transistors. The dielectric layers 203 may include interlayer dielectric (ILD) and inter-metal dielectric (IMD) layers. The ILD and IMD layers may be low-k dielectric layers which have dielectric constants (k values) smaller than a predetermined value, e.g., about 3.9, smaller than about 3.0, smaller than 2.5 in some embodiments. In some other embodiments, the dielectric layers 203 may include non-low-k dielectric materials having dielectric constants equal to or greater than 3.9. The metal lines and vias may include copper, aluminum, nickel, tungsten, or alloys thereof.

In this example, the die group 20 includes through silicon vias (TSVs) or through oxide vias (TOVs) 208 configured to electrically connect the metal lines in the stacked dies 211, 212, and 213 with each other. In an implementation, an individual TSV/TOV 208 may include copper, aluminum, tungsten, alloys thereof, and/or any other suitable materials. TSV/TOVs 208 are arranged in this example to facilitate electronic communication between and among stacked dies 211, 212 and 213. However, it is understood that in some other semiconductor packaging technologies where the present disclosure applies, TSV/TOVs may not be present and thus the TSV/TOVs 208 shown in this example shall not be construed as being intended to limit the present disclosure.

In this example, each of the stacked dies 211, 212, and 213 also includes a side metal interconnect structure 209 on a sidewall of the stack dies. The side metal interconnect structure 209 may include one or more metal wirings extending through an exposed surface of the plurality of dielectric layers 203. The side metal interconnect structure 209 may be formed at the same time as the metal layers and exposed to the side surface of the die group 20 after the different dies 211, 212, and 213 have been bonded together and the side surface is polished by a chemical mechanical polishing (CMP) process.

In some embodiments, the die group 20 can be formed by bonding a plurality of wafers together using fusion bonding, eutectic bonding, metal-to-metal bonding, hybrid bonding processes, and the like. A fusion bonding includes bonding an oxide layer of a wafer to an oxide layer of another wafer. In an embodiment, the oxide layer can include silicon oxide. In a eutectic bonding process, two eutectic materials are placed together, and are applied with a specific pressure and temperature to melt the eutectic materials. In the metal-to-metal bonding process, two metal pads are placed together, a pressure and high temperature are provided to the metal pads to bond them together. In the hybrid bonding process, the metal pads of the two wafers are bonded together under high pressure and temperature, and the oxide surfaces of the two wafers are bonded at the same time.

In some embodiments, each wafer may include a plurality of dies, such as semiconductor devices of FIG. 1. The bonded wafers contain a plurality of die groups having a plurality of stacked dies. The bonded wafers are singulated by mechanical sawing, laser cutting, plasma etching, and the like to separate into individual die groups that can be the die group as shown in FIG. 2.

Figure 3A:
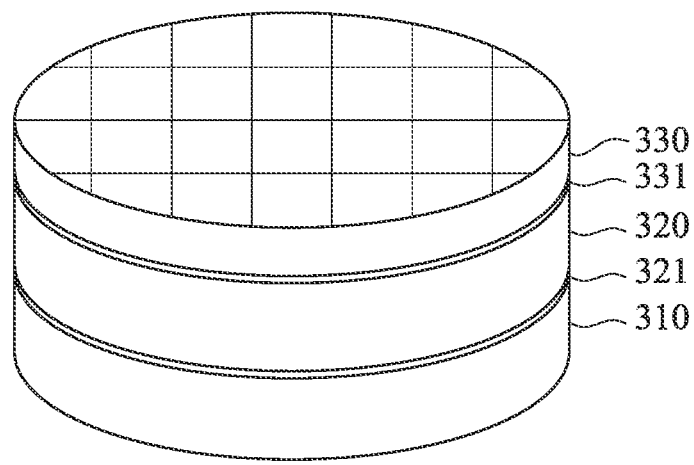
FIG. 3A is a simplified perspective view illustrating a plurality of wafers stacked on top of each other in a three-dimensional (3D) configuration, in accordance with some embodiments.

An Example Wafer on Wafer Configuration in Accordance with the Present Disclosure FIG. 3A is a simplified perspective view illustrating a plurality of wafers stacked on top of each other in a three-dimensional (3D) configuration according to some embodiments. Referring to FIG. 3A, a first wafer 310 is a base wafer on which a plurality of dies can be formed. A second wafer 320 is an intermediate wafer on which a plurality of dies can be formed, and a third wafer 330 is a top wafer on which a plurality of dies can be formed. The wafers may have through substrate vias and/or through oxide vias and backside bonding layer (e.g., metallization layer and/or dielectric layer) and are bonded together to form a 3D stacked wafer configuration using any known bonding techniques, e.g., fusion bonding, eutectic bonding, metal bonding, hybrid bonding, and the like. The three wafers are electrically connected to each other through substrate vias, through oxide vias, and/or backside metallization layer and dielectric layer, etc., labeled as 321 and 331. The wafers each can have different dies. For example, wafer 310 may include dies of central processing units, graphics processing units, and logic; wafer 320 may include dies of memory devices and memory controllers; and wafer 330 may include dies of bus interfaces, input/output ports, and communication and networking devices. In the example shown in FIG. 3A, three wafers are used, but it is understood that the number is illustrative only and is chosen for describing the example embodiment and should not be limiting. In some embodiments, a passivation layer is formed on the upper surface of each of the wafers and includes a thickness to provide separation between the substrate and the metallization layer. The passivation layer includes an oxide material.

Figure 3B:
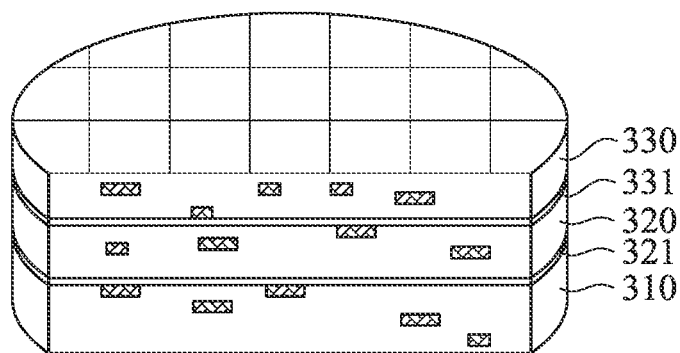
FIG. 3B is a simplified perspective view illustrating the stacked wafer configuration of FIG. 3A that has been cut and separated into individual bars, in accordance with some embodiments.
Figure 3B:
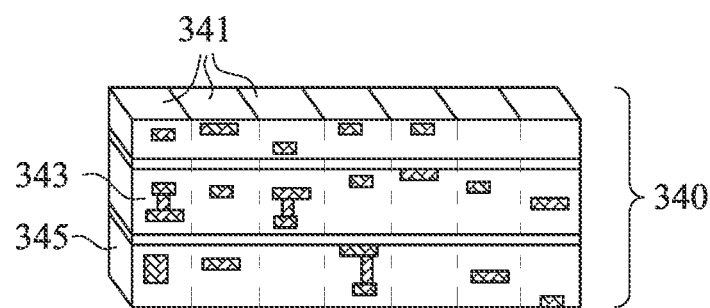

FIG. 3B is a simplified perspective view illustrating a portion of the stacked wafer configuration of FIG. 3A that has been cut and separated into individual bars according to an exemplary embodiment. For example, the stacked wafers can be cut into individual bars and individual die groups by mechanical sawing, plasma etching, laser cutting, and the like. Referring to FIG. 3B, each of the wafers include a substrate, a plurality of dielectric layers including interlayer dielectric layers (ILDs) and inter-metal dielectric layers (IMDs), and a plurality of metal lines and a plurality of vias formed in the dielectric layers. The dies of the stacked wafers are electrically coupled to each other through substrate vias and through oxide vias. FIG. 3B shows an exemplary bar 340, individual dies 341, metal lines and vias 343, and dielectric layers 345. In some embodiments, the individual bars are placed on a polishing board, and the surfaces of the bars are polished prior to being diced or singulated into dies.

Figure 3C:
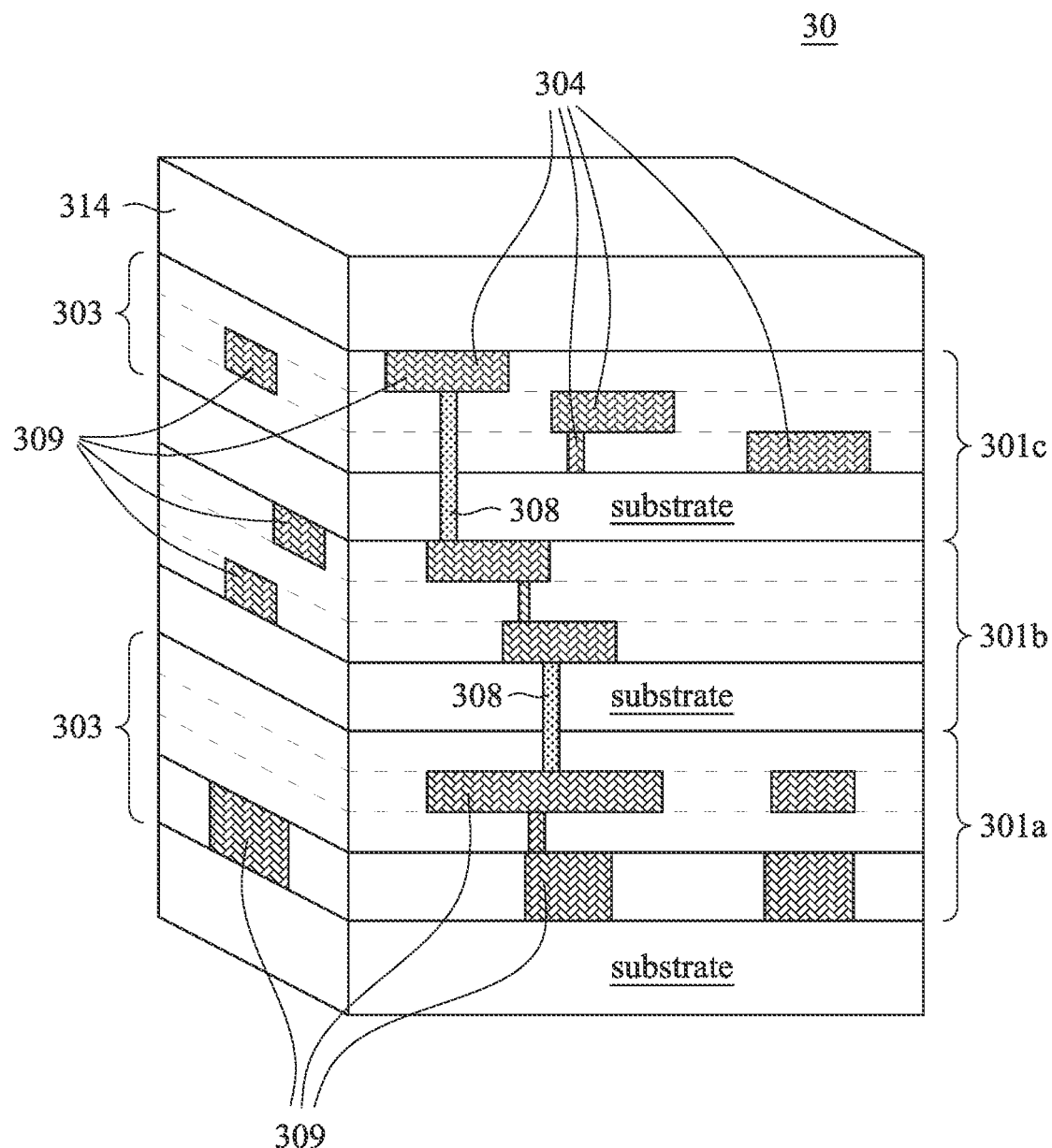
FIG. 3C is a simplified perspective view of an individual die group including a plurality of stacked dies according to an exemplary embodiment.

FIG. 3C is a simplified perspective view of an individual die group 30 including a plurality of stacked dies according to an exemplary embodiment. Referring to FIG. 3C, the die group 30 includes a first die 301a, a second die 301b, and a third die 301c stacked on top of each other. Each of the first, second, and third dies may include a substrate, an active region including a plurality of active devices, a plurality of dielectric layers 303, and a plurality of metal lines and vias 304 in the dielectric layers. The dies are electrically coupled to each other by through substrate vias and through oxide vias 308. The die group 30 further includes a metal structure 309 exposed on a side surface of the die group 30. In an embodiment, the die group 30 also includes a bonding layer 314 including an oxide material, e.g., silicon oxide. In some embodiments, the bonding layer 314 may include a plurality of bonding films. In some embodiments, the die group 30 includes a plurality of semiconductor dies or chips similar to those of FIG. 2.

Sideway Stacking of a Die Group in a Multi-Die Structure

Attention is now directed to stacking of a die group in a multi-die structure. In a multi-die structure, individual dies are laid flat on top of one another. An example of such a die group is shown in FIG. 2. In sideway stacking of a die group, the die group, with individual dies therein, is stood up sideway such that an edge of the die group is pivoted 90 degrees and a surface of that edge is disposed on a surface of a base die structure of the die group. As a result of such a sideway stacking of the die group, the individual dies within the die group are also stood up with respect to the surface of the base die structure. As a conceptual illustration, thus not intended to be limiting, sideway stacking of a die group may be visualized as standing books between two book ends on a shelf, where the books are individual dies (a bottom cover of a given one of the books may be visualized as a substrate of that book), and shelf may be visualized as a base substrate where the die group is located. In co-planar stacking of the die group, the books are piled on top of one another on the shelf.

An Example Sideway Stacking of a Die Group

Figure 4A:
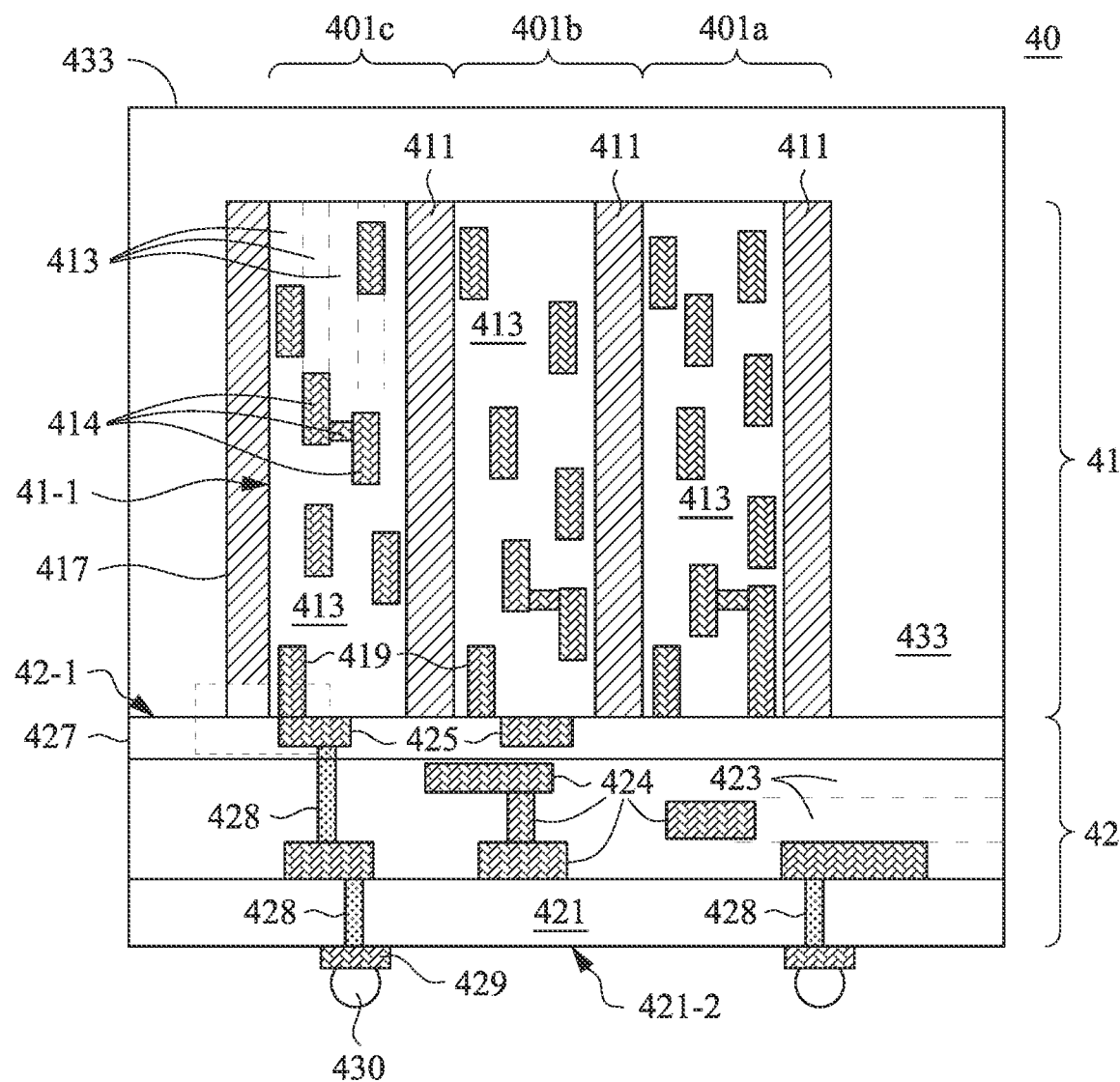
FIG. 4A is a simplified cross-sectional view of a multi-die structure in accordance with some embodiments.

FIG. 4A is a simplified cross sectional view of a multi-die structure 40 according to an exemplary embodiment. FIG. 4A illustrates an example sideway stacking of a die group in accordance various embodiments. Referring to FIG. 4A, the multi-die structure 40 includes a first die group 41 having a first upper surface 41-1 and a second die group 42 having a second upper surface 42-1; the first and second die groups 41 and 42 are disposed substantially perpendicular to each other as shown such that the surface 41-1 and the surface 42-1 are perpendicular to each other. The first die group 41 includes a plurality of dies 401a, 401b, and 401c stacked next to each other, each die includes a substrate 411, a plurality of dielectric layers 413, a plurality of metal lines and vias 414 in the dielectric layers 413. The first die group 41 also includes a passivation layer 417 on the first upper surface, and a side metal structure 419 disposed on a side surface of the first die group 41. The passivation layer 417 includes an oxide material. In an embodiment, the passivation layer 417 is free of a metal interconnect structure. The first die group 41 may be similar or the same as the die group 20 of FIG. 2 or die group 30 of FIG. 3C, so that a description of which will not be repeated herein for the sake of brevity.

In some embodiments, the first die group 41 undergoes a polishing process, e.g., chemical mechanical polishing (CMP), at a side surface of the die edges to expose side metal structures 419 to facilitate connecting to the die group 42 in a sideway bonding process. In some embodiments, the metal structures 419 and dielectric layers 413 exposed at the side surface are used in sideway bonding to die group 41 in a hybrid bonding involving dielectric-to-dielectric and metal-to-metal bonding. It is understood, however, an etching process can be used instead of the CMP process or in conjunction process. Further, other bonding processes can be used instead of hybrid bonding, such as fusion bonding, and bonding processes using solders, bumps, etc.

The second die group 42 includes a substrate 421, a plurality of dielectric layers 423, a plurality of metal lines and vias 424 in the dielectric layers 423, a passivation layer 427 on the second upper surface of the substrate 421. The passivation layer 427 includes an oxide material. In an embodiment, the passivation layer 427 may be a hybrid passivation layer having a plurality of metal pads 425 in the oxide material. The second die group 42 also includes one or more through silicon vias and through oxide vias 428 electrically coupled to the metal structure 419 either directly or through the metal pad 425. In an embodiment, the second die group does not include active devices (e.g., transistors) or passive devices (resistors, diodes, inductors). In an embodiment, the substrate 421 can include active and/or passive devices formed therein. The substrate 421 can include doped or undoped silicon, an active layer of a semiconductor-on-insulator (SOI) substrate or other semiconductor materials, e.g., germanium; a compound semiconductor including silicon carbide, gallium arsenic, gallium phosphide, indium phosphide, indium arsenide, an alloy semiconductor including SiGe, GaAsP, AlGaAs, GaInAs, GaInP; or combinations thereof. Other substrates, such as multi-layered or gradient substrates, may also be used. In an embodiment, devices, such as transistors, diodes, capacitors, resistors, may be formed in the substrate and may be interconnected by interconnect structures by metallization patterns in one or more dielectric layers 423. In the example shown in FIG. 4A, a single substrate 421 is used for the second die group 42, but it is understood that the number is illustrative only and is chosen for describing the example embodiment and should not be limiting. That is, the second die group 42 can include a stack of dies stacked on top of each other.

The first die group 41 is attached to the second die group 42 with the first and second passivation layers 417, 427 and/or by the side metal structure 419 and metal pads 425 in the hybrid passivation layer 427. In some embodiments, the first die group 41 and the second die group 42 are bonded by fusion bonding, direct bonding, dielectric bonding, metal bonding, hybrid bonding, or the like. In the fusion bonding, the oxide surfaces of the passivation layers 417, 427 are bonded together. In the metal bonding, a metal surface of the side metal structure 419 and a metal surface of the metal pads 425 are pressed against each other at an elevated temperature, the metal inter-diffusion causing the bonding of the side metal structure 419 and the metal pads 425. In the hybrid bonding, the metal surface of the side metal structure 419 and the metal surface of the metal pads 425 are bonded together and the oxide surfaces of the passivation layers 417, 427 are bonded together. In some embodiments, the second die group 42 is a base die group or bottom die group configured to provide mechanical support and electrical wirings to the attached first die group 41. The first die group 41 is referred to as a top die group, and the second die group 42 is referred to as a bottom die group. In some embodiments, the second die group 42 may have a plurality of bond pads 429 on a lower surface 421-2 of the substrate 421, each bond pad being electrically coupled to an under metal bump or micro bump 430. In an embodiment, the metal pads 425 have a surface coplanar with an upper surface of the passivation layer 427. In some embodiments, the multi-die structure 40 also includes an around die dielectric 433 layer encapsulating the first die group 41 and the second die group 42 after they are bonded together. In an embodiment, the around dielectric 433 includes tetraethyl orthosilicate (TEOS), silicon oxide, and the like.

Figure 4B:
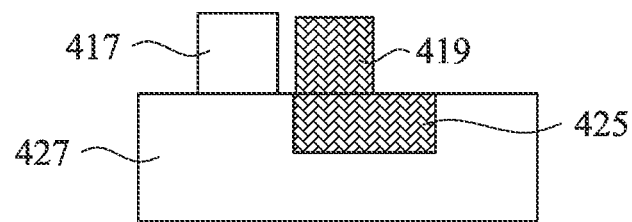
FIG. 4B is an enlarged cross-sectional view of a portion of the multi-die structure of FIG. 4A, in accordance with some embodiments.

FIG. 4B is a cross-sectional view of an enlarged portion (indicated by a dotted-line rectangle) of the multi-die structure 40 of FIG. 4A. Referring to FIG. 4B, oxide surfaces of the first passivation layer 417 and second passivation layer 427 are fusion bonded together. The passivation layers 417 and 427 each include an oxide material and function as bonding layers. In an embodiment, the metal structure 419 and the metal pad 425 are metal-to-metal bonded together. In an embodiment, each of the metal structure 419 and the metal pad 425 may include copper for a copper-to-copper bonding. In an embodiment, each of the metal structure 419 and the metal pad 425 may include aluminum for an aluminum-to-aluminum bonding. In an embodiment, each of the metal structure 419 and the metal pad 425 may include tin or tin alloy for a tin-to-tin or tin alloy bonding. In an embodiment, the metal structure 419 and the metal pad 425 function as interconnect layers. In an embodiment, the metal structure 419 and the metal pad 425 function as bonding layers, rather than interconnect layers. In an embodiment, the metal structure 419 and the metal pad 425 function as thermal dissipation layers to mitigate hot spots in the die group. In an embodiment, the metal structure 419 and the metal pad 425 are connected to a grounding plane for electromagnetic shielding of some functional devices of the die group. In an embodiment, the metal structure 419 and the metal pad 425 can have more than one of the functions described above. In an embodiment, the metal pad 425 may include a micro metal bump or a solder bump. The metal pads have a coefficient of thermal expansion (CTE) higher than that of the passivation layers (i.e., oxide bonding layers). The different CTEs can cause problems in bonding the passivation layers, such as warpage and breakage (chip cracking) of the second die group 42.

Examples of Multi-Die Structure Having Multiple Sideway Stacked Die Groups

Attention is now directed to FIGS. 5-6, where two examples of multi-die structures are shown to illustrate multi-multi-die structures of interest to the present disclosure. They will be described below with reference to FIGS. 1-4.

Figure 5A:
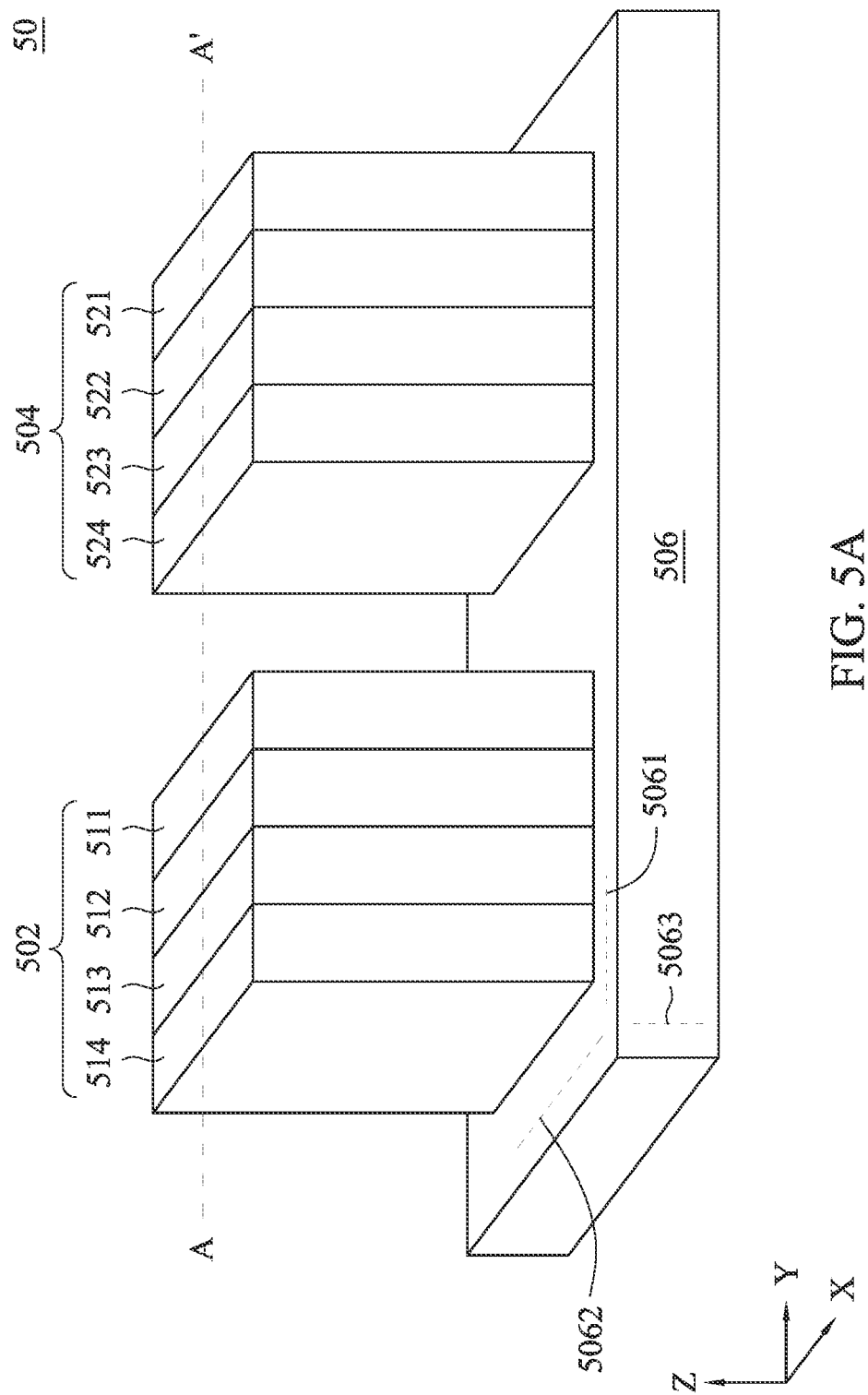
FIG. 5A is a simplified three-dimensional view of a three-dimensional (3D) multi-die structure, in accordance with some embodiments.

FIG. 5A is a simplified three-dimensional view of a 3D multi-die structure, in accordance with some embodiments. As shown in FIG. 5A, the 3D multi-die structure 50 includes a first die group 502, a second die group 504, and a third die group 506. In this example, each of the first and second die groups 502 and 504 are formed by stacking a plurality of dies on top of each other. For example, the first die group 502 includes dies 511, 512, 513, and 514 as shown. Dies 511-514 in the first die group 502 are stacked on top of each other, in a process similar to that described in connection with FIG. 3C. Die group 502 is then vertically stacked sideways on the third die group 506, which functions as a base die structure. In this way, the dies 511, 512, 513, and 514 also appear to be stacked sideways with respect to the third die group 506. Similarly, dies 521, 522, 523, and 524 in the second die group 504 are stacked on the third die group 506, and stand up sideways on the third die group 506. More details are described below with reference to FIG. 5B, which is a cross-sectional view of the 3D multi-die structure 50 along a cut line A-A' shown in FIG. 5A.

Figure 5B:
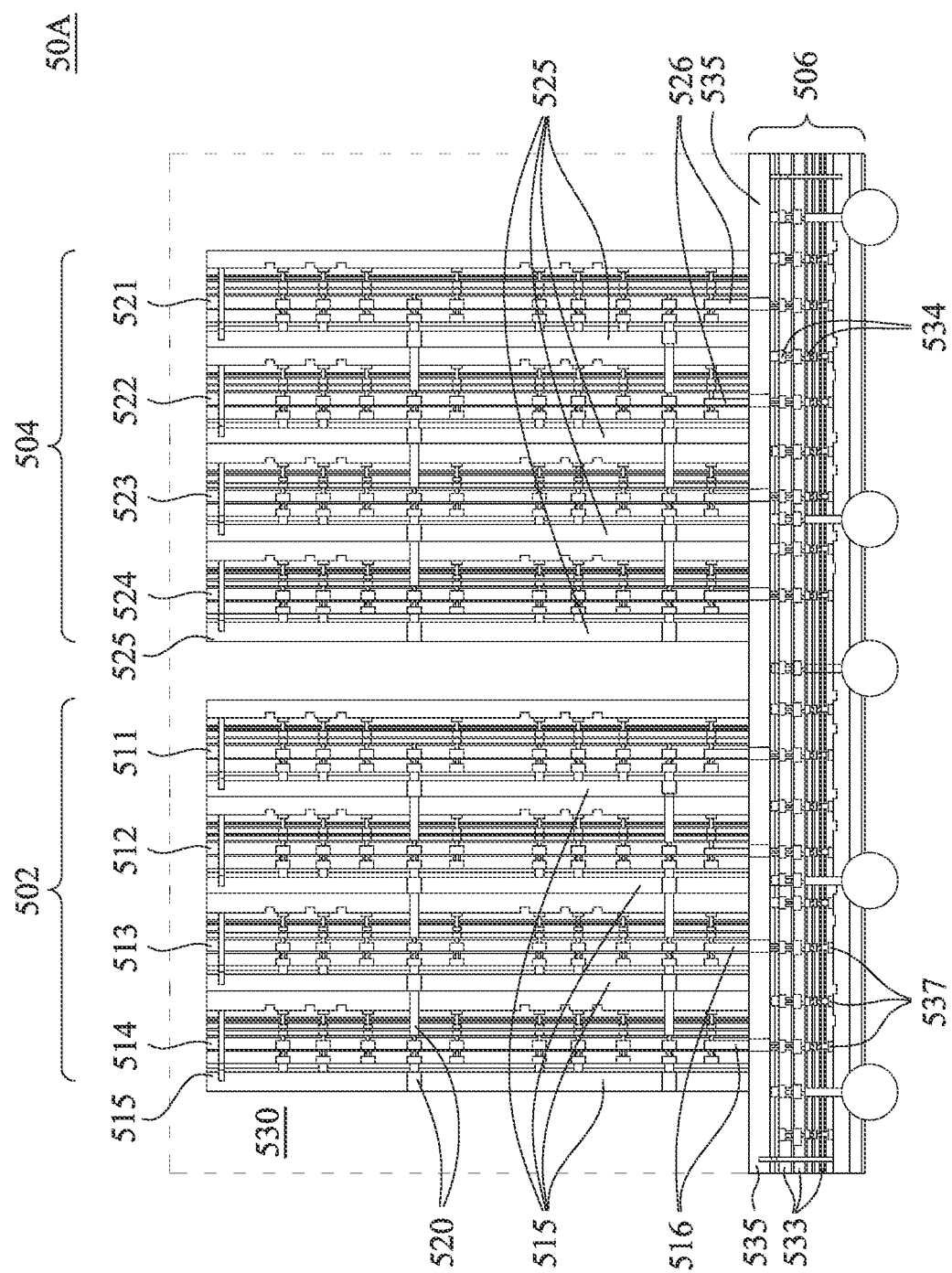
FIG. 5B is a cross-sectional view of an example of the 3D multi-die structure of FIG. 5A, in accordance with some embodiments.

FIG. 5B is a cross-sectional view of an example three-dimensional (3D) multi-die structure 50. Referring to FIG. 5B, the 3D multi-die structure 50 includes a first die group 502 (also referred to as "Top die group 1"), a second die group 504 (also referred to as "Top die group 2"), and a third die group 506 (also referred to "Bottom die group 1"). In this example, each of the first and second die groups 502 and 504 are formed by stacking a plurality of dies on top of each other. For example, the first die group includes a die 511, a die 512 a die 513, and a die 514. As can be seen, each of these dies includes a substrate, a plurality dielectric layers, and a plurality of metal lines and vias in the dielectric layers, similar to the semiconductor device 10 of FIG. 1. A plurality of TSV/TOVs 520 are arranged in the first die group 502 to provide electrical connections between the stacked dies, similar to the die group 20 of FIG. 2 or die group 30 of FIG. 3C.

Similarly, the second die group 504 includes a die 521, a die 522, a die 523, and a die 524. The dies in the second die group 504 have similar structures to those in the first die group 502. As can be seen, the first die group 502 includes bonding members 515 on an outer surface of the first die group 502 as well as within the first die group 502 (in-between the dies 511-514) in this example. In an embodiment, the bonding members 515 are free of a metal interconnection structure. For example, the first die group includes the bonding members 515 disposed on the surface of the die 514 and free of a metal interconnect structure. As mentioned above, in some implementations, the bonding members 515 may include hybrid bonding films of Si, SiO2, Cu and/or any other suitable hybrid bonding film materials.

In this example, the second die group 504 includes bonding members 525 on an outer surface of the die and as well as within the second die group as shown. In an implementation, the bonding members 525 may have a same or substantially similar structure to the bonding members 515. However, this is not intended to be limiting. It is understood that the bonding members 515 and 525 may have different structures among themselves.

In this example, the first die group 502 also includes a metal connection member 516 on a side surface of the first die group, and the second die group 504 also includes a metal connection member 526 on a side surface of the second die group. The metal connection members 516 and 526 are configured in this example for connecting the first die group 502 and the second die group 504 to the third die group 506. In an implementation, the third die group 506 can function as a base substrate, a support substrate, a carrier substrate, an interposer, or any other component for the die structure 50. In this example, the third die group 506 has a dimension greater than a total dimension of the first and second die groups 502 and 504. In some embodiments, the third die group 506 includes a substrate and wirings configured to provide electrical connections between the first and second die groups 502 and 504.

In this example, the third die group 506 includes a plurality of active devices 537 on the substrate, a plurality of dielectric layers 533 on the active devices, and a plurality of metal lines and vias 534 in the dielectric layers 533. In this example, the third die group includes a bonding member 535 having a planar surface configured to bond with the bonding layers 515 and 525 of the first and second die groups. In an embodiment, the bonding member 535 is a hybrid bonding member including an oxide material (e.g., silicon oxide) and a plurality of bond pads in the oxide material configured to couple to the metal connection members 516 and 526 of the first and second die groups, respectively. In an embodiment, the third die group also includes a plurality of under metal bumps or micro bumps (denoted "bump") on its lower surface. In an embodiment, the 3D multi-die structure 50 also includes an around die dielectric layer 530 overlying the first, second and third die group after the first and second die groups have been mounted or bonded to the third die group. The around die dielectric layer 530 includes TEOS or silicon oxide.

In some embodiments, the first die group 502 and the second die group 504 each is formed by bonding a plurality of wafers on top of each other, and a cutting process (plasma etch, mechanical sawing, laser cutting) is performed on the bonded wafers to separate the bonded wafers into individual bars; the bars are then polished and singulated to individual die groups. In an embodiment, the singulation process may be performed by mechanical sawing. In an embodiment, the singulation process may be performed using suitable techniques, e.g., plasma etching, laser cutting, to prevent cracking and chipping.

Referring to FIG. 5B, as can be seen, each of the first die group 502 and the second die group 504 is rotated into its side surface by 90 degrees, so that the bonding members 515 and 525 are vertically disposed on an upper surface of the bonding member 535 of the third die group 506 through a side surface (also referred to as edge surface) of the respective bonding members 515 and 525. It is understood that the edge surface of the bonding member is substantially flush with the side surface of the top die group within a manufacturing tolerance. Each of the first and second die groups 502 and 504 is electrically coupled to the third die group 506 through the respective connection members 516 and 526. In an embodiment, the connection member is the side metal interconnect structure 209 of FIG. 2 or the side metal structure 419 of FIGS. 4A and 4B. In an embodiment, the third die group may have one or more dies stacked on top of each other. In that embodiment, the one or more dies of the third die group are electrically connected to another circuitry on a printed circuit board (not shown) through the plurality of under metal bumps or micro bumps. In that embodiment, the dies in the third die group 506 are stacked as described and illustrated herein.

Warpage in a Multi-Die Structure

In FIG. 5A, die groups 502, 504, and 506 may have different coefficients of thermal expansion (CTE). For example, the CTE of a dielectric material is from about 0.8 to about 8 ppm/° C., the CTE of copper is about 14 to 18 ppm/° C., and the CTE of silicon is about 2.5 ppm/° C. The CTE mismatch may cause die breakage and warpage, in particular as dies are getting thinner. The problems become more severe as the dies and the device package are subjected to high-temperature processes, such as solder reflow, that cause warpage, breakage, and delamination of the dielectric layers and conductive layers. Warpage of the device package can cause die breakage and bonding failures and reduce reliability of electrical connection across the dies in the die groups.

Figure 5C:
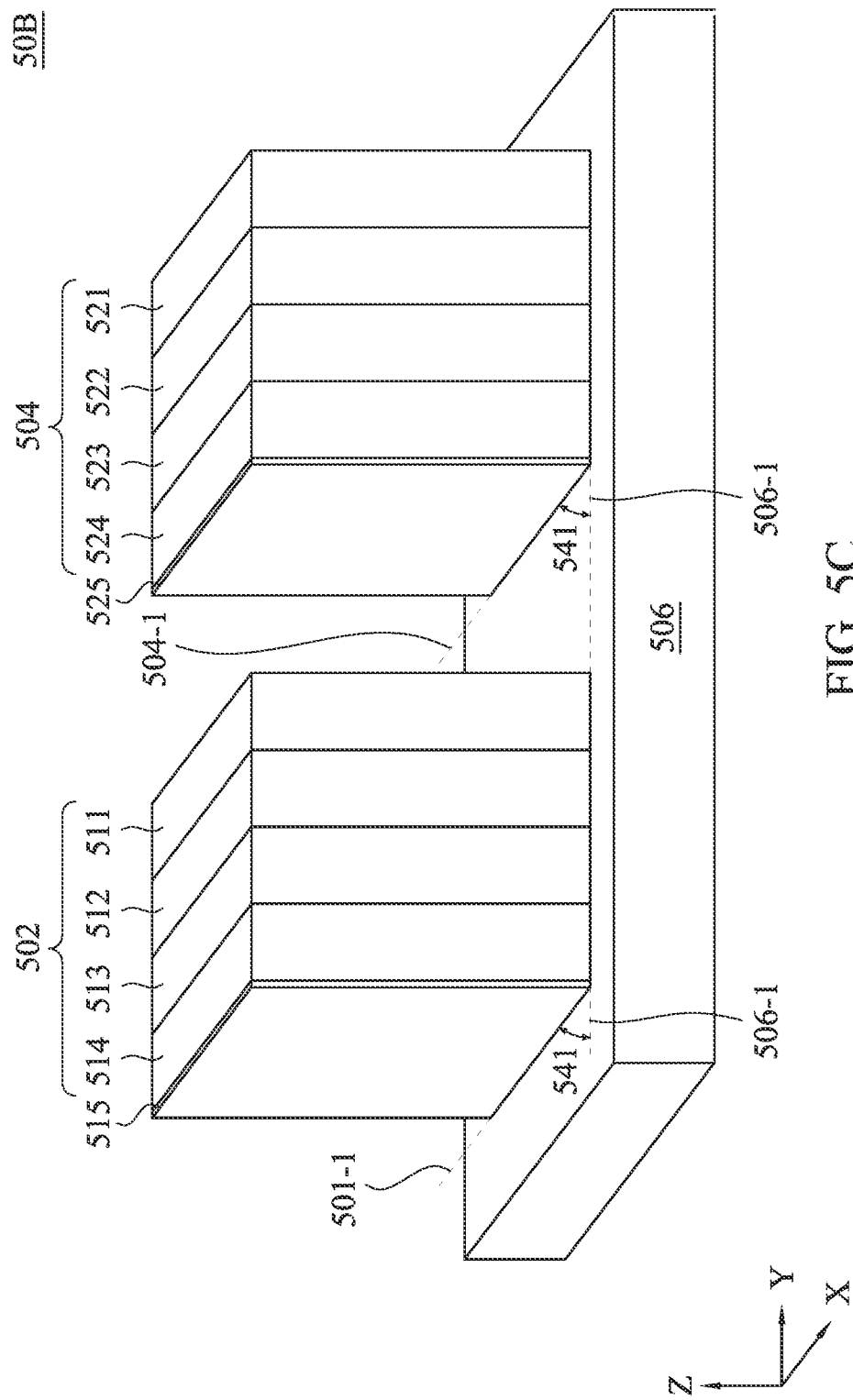
FIG. 5C is a three-dimensional view of the 3D multi-die structure shown in FIG. 5B.

The inventor has observed that when the die groups are arranged substantially parallel to each other, the stress and warpage of the device package are amplified. An example is illustrated in FIG. 5C, which is a simplified a three-dimensional view of a 3D multi-die structure, in accordance with some embodiments. As shown in FIG. 5C, the 3D multi-die structure 50B, similar to 3D multi-die structure 50A in FIG. 5B, includes a first die group 502, a second die group 504, and a third die group 506. For example, as shown in FIG. 5C, the first bonding member 515 of the first die group 502 is disposed on the third die group 506 along a first direction 502-1 to form a first angle 541 with respect to a reference direction 506-1, which, in this case, is parallel to an edge of the third die group 506. The second bonding member 525 of the second die group 504 is disposed on the third die group 506 along a second direction 504-1 to form a second angle 542 with respect to the reference direction 506-1. As can be seen in FIG. 5C, the first and second angles 541 and 542 of the bonding members 515 and 525 with respect to the third die group 506 are the same or substantially similar due to the first and second die groups being stacked sideway on the third group 506 in a parallel fashion. As mentioned, different coefficients of thermal expansion of the bonding members 515, 525, and 535 can cause mechanical stresses to the third die group 506, resulting in die cracking and/or die breakage in the third die group 506. The parallel arrangement of top die groups further amplifies the mechanical stress.

The crystalline planes of a single crystalline wafer are often characterized by Miller indices. A family of lattice planes is determined by three integers h, k, and ℓ, written as (hkℓ). The Miller indices are defined with respect to a basis of lattice vectors in a unit cell. For example, silicon has a diamond cubic crystal structure and has an fcc (face centered cubic lattice structure. Semiconductor device fabrication often uses (100) wafers, where the top surface of the wafer is in the (100) plane. In some embodiments, the substrate of the third die group is made of a single crystalline silicon characterized by the (100), (010), and (001) planes forming the faces of the unit cell.

In FIG. 5A, lines 5061, 5062, and 5063 illustrate edges of the (100) family crystalline plane perpendicular to the X, Y, and Z axes, respectively. In this example, these planes are parallel to the surface and edges of the die, respectively. It is understood, however, that in some embodiments, edges and surfaces of the dies may not be parallel to crystalline lattice planes.

The inventor has observed that the substrate is more susceptible to warpage, cracking, and breakage along the crystalline lattice planes. In the 3D package structures, such as multi-die structure 50 in FIG. 5A, if the top die groups are aligned to the crystalline lattice planes of the dies in the base substrate structure, as shown in the examples of FIGS. 5A and 5B, and cracking and breakage of the base substrate are more likely to occur.

Die Group Arrangements

For addressing the aforementioned problems, various arrangements of die groups in a multi-die structure are provided by the present disclosure to prevent deformation and warpage of the support provided by a bottom die group in a multi-die structure caused by mechanical and thermal stresses, resulting in chip cracking and breakage in certain situations.

Figure 6A:
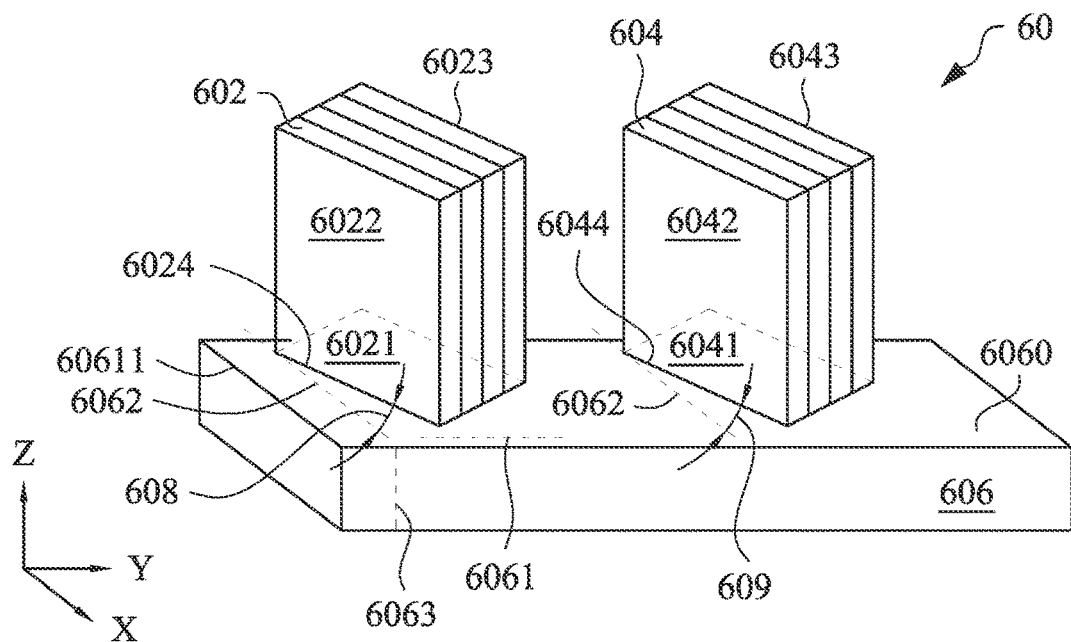
FIG. 6A is a three-dimensional view of a 3D multi-die structure, in accordance with some embodiments.

FIG. 6A is a simplified three-dimensional view of a 3D multi-die structure 60 according to an exemplary embodiment. Referring to FIG. 6A, the 3D multi-die structure 60 includes a first die group 602, a second die group 604, and a base substrate 606. In some embodiments, base substrate structure 606 can include a third die group. In some embodiments, base substrate structure 606 can include a support substrate, a carrier substrate, an interposer, or any other substrate structure for the die structure 60. Various examples of die groups 602, 604, and base substrate structure 606, also referred to as the third die group, are described and illustrated in connection with FIGS. 1-5C.

As also can be seen in the example of FIG. 6A, each of the first and second die groups 602 and 604 are stacked sideway on a top surface 6060 of the base substrate structure 606. An edge surface 6021 (hidden in FIG. 6A and shown in broken lines) of the first die group 602 is bonded to top surface 6060 of the base substrate structure 606. As shown in FIG. 6A, the edge surface 6021 of the first die group 602 is at the bottom of the sideway standing first die group 602. The first die group 602 also has a front surface 6022 and a back surface 6023, in the convention corresponding to the front and back surfaces of dies in the first die group. The front surface 6022 and the edge surface 6021 intersect at edge 6024, which lies on the top surface 6060 of the base substrate structure 606. Edge 6024 defines the orientation of the first die group 602 on the base substrate 606.

Similarly, an edge surface 6041 (hidden in FIG. 6A and shown in broken lines) of the second die group 604 is bonded to top surface 6060 of the base substrate structure 606. As shown in FIG. 6A, the edge surface 6041 of the second die group 604 is at the bottom of the sideway standing second die group 604. The second die group 604 also has a front surface 6042 and a back surface 6043, in the convention corresponding to the front and back surfaces of dies in the second die group. The front surface 6042 and the edge surface 6041 intersect at edge 6044, which lies on the top surface 6060 of the base substrate structure 606. Edge 6044 defines the orientation of the second die group 604 on the base substrate 606.

In FIG. 6A, lines 6061, 6062, and 6063 illustrate edges of the (100) family crystalline plane perpendicular to the X, Y, and Z axes, respectively. As still can be seen, each of the first and second die groups 602 and 604 is stacked non-parallel with respect to the crystalline planes 6061 and 6062 of the substrate of the base substrate structure 606.

Figure 6B:
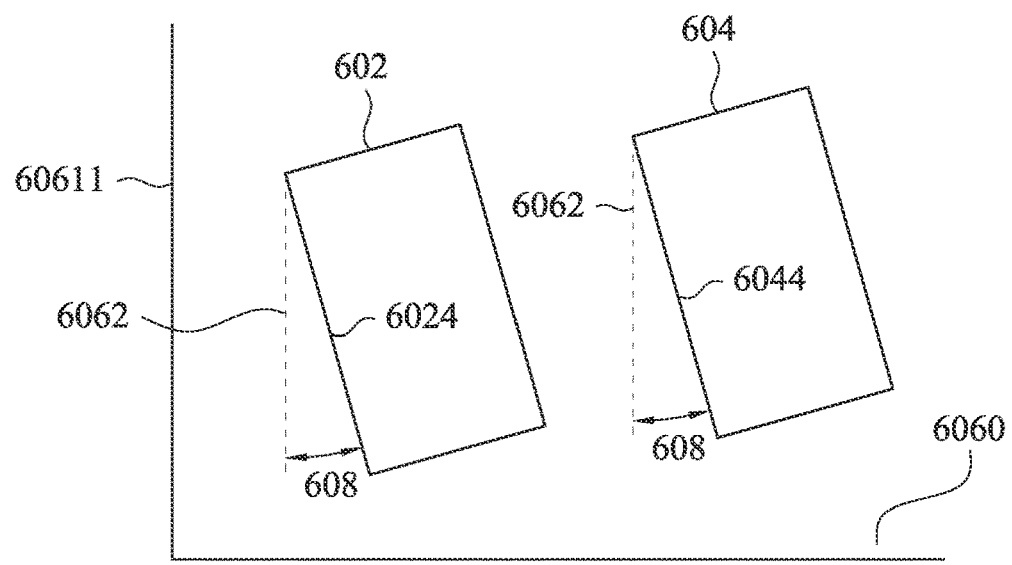
FIG. 6B is a top view of the 3D multi-die structure of FIG. 6A, in accordance with some embodiments.

Referring to FIG. 6B, which shows a top view of the multi-die structure 60 shown in FIG. 6A. The view shown in FIG. 6B represents a cut view of where the first and second die groups 602 and 604 are disposed on the surface 6060. As can be seen in FIGS. 6A and 6B, in this example, the first die group 602 is sideway stacked non-parallel with respect to the lattice crystalline plane 6062 such that an edge 6024 of the first die group 602 forms an angle 608 with the lattice crystalline plane 6062. Similarly, the second die group 604 is sideway stacked non-parallel with respect to the lattice crystalline plane 6062 such that an edge 6044 of the second die group 604 forms an angle 609 with the lattice crystalline plane 6062. Such a non-parallel sideway stacking of die group 602 can reduce stress accumulation and the risk of chip breakage or cracking die group 606. In some embodiments, the angles 608 and 609 can be greater than 0 degrees and less than 360 degrees. For example, in some embodiments, the angles 608 and 609 can be between 2 and 358 degrees. In some embodiments, the angles 608 and 609 can be between 4 and 356 degrees. In some embodiments, the angles 608 and 609 can be between 10 and 350 degrees. In some embodiments, the angles 608 and 609 can be greater than 0 degrees and less than 90 degrees. For example, in some embodiments, the angles 608 and 609 can be between 2 and 88 degrees. In some embodiments, the angles 608 and 609 can be between 4 and 86 degrees. In some embodiments, the angle 608 can be between 10 and 80 degrees. Depending on the embodiments, angles 608 and 609 may or may not be the same.

In the examples described above, the crystalline planes are parallel to the surface and edges, e.g., 60611, of the dies in the bottom die group, respectively. In this case, an edge 6024 of the first die group 604 forms an angle 609 with an edge 60611 of the surface 6060. Further, an edge 6041 of the second die group 602 forms an angle 608 with the edge 60611 of the surface 6060. It is understood, however, that in some embodiments, edges and surfaces of the dies may not be parallel to crystalline lattice planes.

Figure 7:
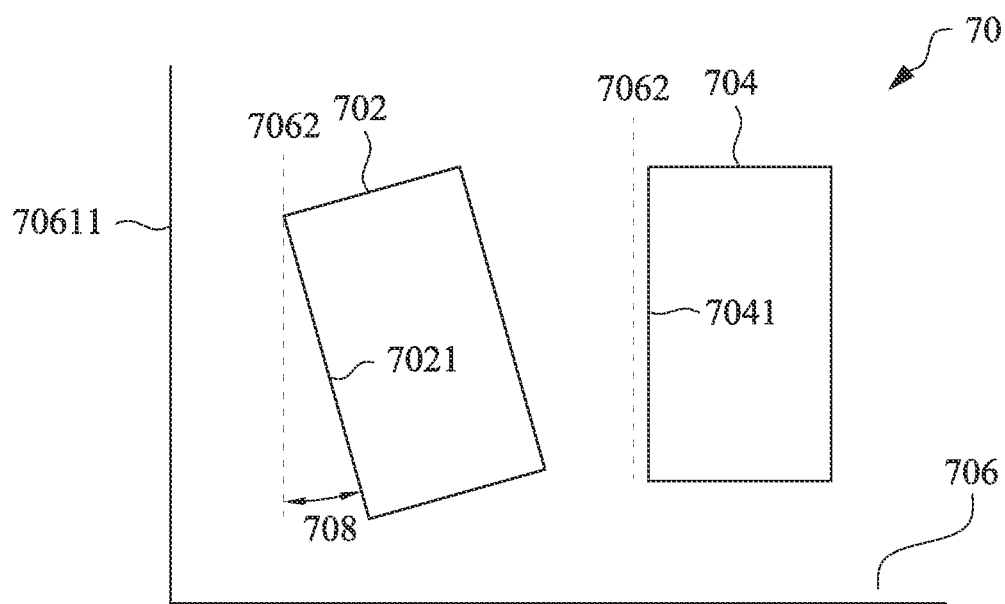
FIG. 7 is a top view of a 3D multi-die structure, in accordance with some embodiments.

FIG. 7 shows another example of stacking die groups in accordance with the disclosure. In this example, multi-die structure 70 includes a first die group 702, a second die group 704 stacked sideway on a surface of a third die group 706 in the multi-die structure. As can be seen, in this example, the first die group 702 is stacked with an edge 7021 non-parallel with respect to the lattice crystalline plane 7062 of third die group 706 to form a non-zero angle 708 between an edge of the first die group 702 and the lattice crystalline plane 7062. In an implementation, the angle 708 can be greater than 0 degrees and less than 90 degrees. For example, in some embodiments, the angle 708 can be between 2 and 88 degrees. In some embodiments, the angle 708 can be between 4 and 86 degrees. In some embodiments, the angle 708 can be between 10 and 80 degrees.

As used herein, the term non-parallel refers to an alignment in which the angle between two elements is between 2 and 358 degrees. In some embodiments, the angle between two elements can be between 4 and 356 degrees. In some embodiments, the angle between two elements can be between 10 and 350 degrees. In some embodiments, the term non-parallel refers to an alignment in which the angle between two elements is greater than 0 degrees and less than 90 degrees. For example, in some embodiments, the angles can be between 2 and 88 degrees. In some embodiments, the angles can be between 4 and 86 degrees. In some embodiments, the angle can be between 10 and 80 degrees.

In this example, an edge 7041 of the second die group 704 is stacked parallel with respect to the lattice crystalline plane 7062. In this example, the die edge surface 70611 of the bottom die group 706 is parallel to an edge 7041 of the second die group such that edge 7041 and edge 70611 are parallel. However, in some cases, the die edge of the third die group may not be parallel to a crystalline lattice plane.

Figure 8:
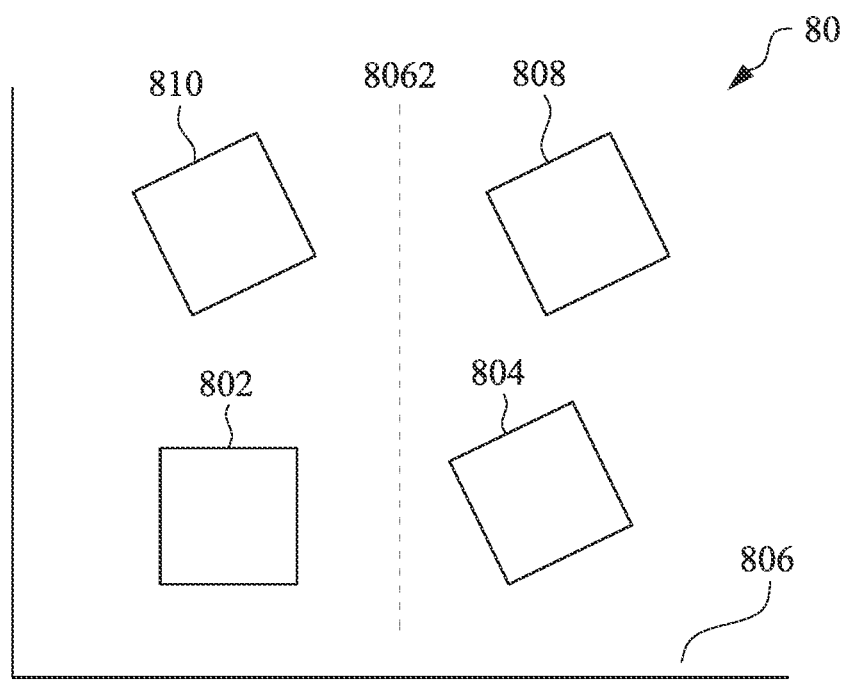
FIG. 8 is a top view of a 3D multi-die structure, in accordance with some embodiments.

FIG. 8 shows still another example of stacking die groups in accordance with the disclosure. In this example, multi-die structure 80 includes a first die group 802, a second die group 804, a third die group 806, a fourth die group 808, and a fifth die group 810. As shown in FIG. 8, the die groups 802, 804, 808, and 810 are stacked sideway on the third die group 806. As can be seen, in this example, the first die group 802 is disposed parallel to the direction of a lattice crystalline plane 8062 of the third die group 806. As still can be seen, in this example, the die groups 804, 808, and 810 are disposed non-parallel to the lattice crystalline plane 8062 of the third die group 806. In some embodiments, at least one of the die groups 802, 804, 808, and 810 stacked on top of the base substrate structure, which in this case is the third die group 806, is aligned non-parallel to the third die group to reduce or avoid cracking or breakage of the package. The top die groups 802, 804, 808, and 810 do not need to be aligned in the same direction.

As mentioned herein, individual dies in the die groups shown in this example include a substrate, a plurality of dielectric layers on the substrate, and a plurality of metal lines and vias in the dielectric layers. Each die may have a structure similar to that of the semiconductor device 10 of FIG. 1. Each of the first, second, fourth, and fifth die groups also includes bonding members used to bond one another as well as the base die group at the bottom. In an embodiment, the bonding members include an oxide material. Each of the first, second, fourth, and fifth die groups may have a structure similar to the die groups shown in FIG. 5A and/or of FIG. 6. In an embodiment, the third die group includes a substrate, a plurality of dielectric layers on the substrate, a plurality of metal lines and vias in the dielectric layers, and a bonding layer on the dielectric layers. In an embodiment, the third die group can have a structure similar to the third die group 506 of FIG. 5A or die group 606 of FIG. 6. The third die group has a first dimension (e.g., horizontal surface area) greater than a total second dimension (e.g., a sum of side surface areas in a vertical direction) of the first, second, fourth, and fifth die groups, so that the first, second, fourth, and fifth die groups can be disposed on a main surface of the bonding layer of the third die group.

The above description in connection to FIGS. 6A, 6B, 7, and 8 addresses the relative orientation of the top die groups with respect to the lattice crystalline planes of the base substrate. Attention is now directed to the stress and warpage of a 3D multi-die structure as a result of the relative orientation of the top die groups. As described above in connection to FIG. 5C, when the die groups are arranged substantially parallel to each other, the stress and warpage of the device package are amplified. To address this problem, various arrangements of die groups in a multi-die structure are provided below to reduce or prevent deformation and warpage.

Figure 9A:
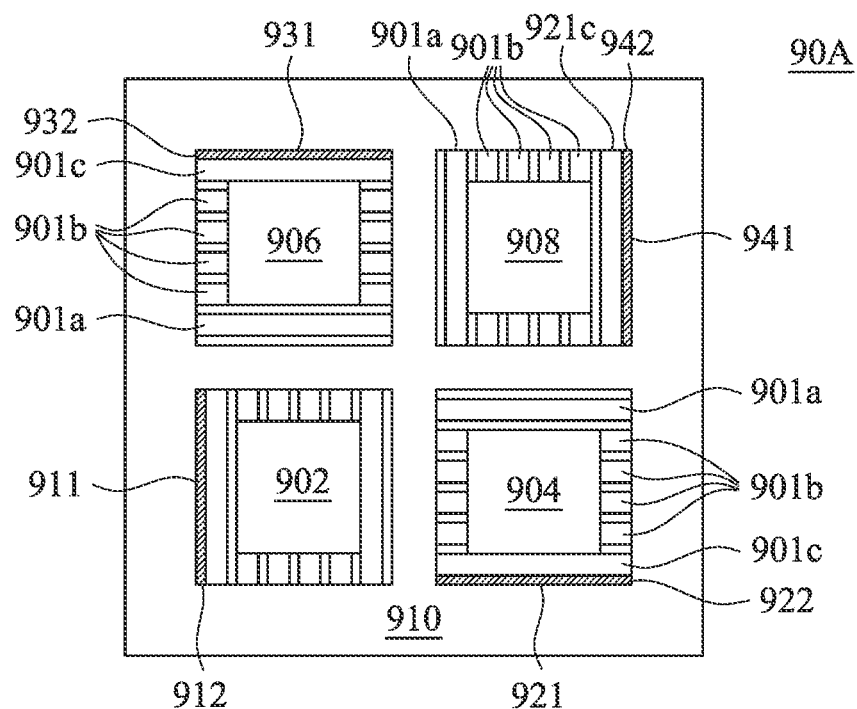
FIG. 9A is a top view of a 3D multi-die structure according to an exemplary embodiment.

FIG. 9A is a simplified top view of a 3D multi-die structure 90A according to an exemplary embodiment. Referring to FIG. 9A, the 3D multi-die structure 90A includes a first die group 902, a second die group 904, a third die group 906, and a fourth die group 908 disposed on a surface 910 of a fifth die group—e.g., a base die group, also referred to as a base substrate. As can be seen, each of the first, second, third, and fourth die groups includes a plurality of dies 901, i.e., dies 901a, 901b, 901c. As mentioned herein, individual dies in the die groups shown in this example include a substrate, a plurality of dielectric layers on the substrate, and a plurality of metal lines and vias in the dielectric layers. Each die may have a structure similar to that of the semiconductor device 10 of FIG. 1. Each of the first, second, third, and fourth die groups also includes bonding members used to bond one another as well as the base die group at the bottom. In an embodiment, the bonding members include an oxide material. Each of the first, second, third, and fourth die groups may have a structure similar to the die groups shown in FIG. 5A and/or of FIG. 5B. In an embodiment, the fifth die group includes a substrate, a plurality of dielectric layers on the substrate, a plurality of metal lines and vias in the dielectric layers, and a bonding layer on the dielectric layers. In an embodiment, the fifth die group can have a structure similar to the third die group 506 of FIG. 5A or third die group 506 of FIG. 5B. The fifth die group has a first dimension (e.g., horizontal surface area) greater than a total second dimension (e.g., a sum of side surface areas in a vertical direction) of the first, second, third, and fourth die groups, so that the first, second, third, and fourth die groups can be disposed on a main surface of the bonding layer of the fifth die group.

As discussed above, an insight provided by the present disclosure is that when top die groups (i.e., first, second, third, and fourth die groups) are arranged substantially parallel to each other, the different coefficients of thermal expansion of the bonding members and connection members cause mechanical stresses to the base die group (i.e., the fifth die group in this example), resulting in deformation and warpage, resulting in die cracking and/or die breakage in the base die group. In various embodiments, for addressing this problem, the first, second, third, and fourth die groups are arranged in different directions with respect to each other. For example, the side surfaces of the bonding members of the first, second, third, and fourth die groups are bonded to the main surface of the bonding layer of the fifth die group such that side surfaces of the bonding members of adjacent die groups form a non-zero angle on the main surface of the fifth die group. In other words, in those embodiments, side surfaces of the bonding members of adjacent die groups can intersect with each other if extended on a surface of the fifth die group. In such an arrangement, stress profiles of the first, second, third, and fourth die groups can change unequally when heated, thereby reducing the stress accumulated on the fifth die group (base die group) and preventing die or chip cracking or breakage in the fifth die group.

In an embodiment, the angle between the different die groups (i.e., the first, second, third, and fourth die groups) can be greater than 0.5 degree, which is sufficient to reduce stress accumulation and the risk of chip breakage or cracking in the bottom die group. In the example shown, the first die group 902 includes a first bonding member 911 disposed on the outer surface of the first die group and having a first edge surface in contact with the outer surface of the base die group along a first direction 912. The second die group 904 includes a second bonding member 921 disposed on the outer surface of the second die group 904 and having a second edge surface in contact with the outer surface 910 of the base die group along a second direction 922. The third die group 906 includes a third bonding member 931 disposed on the outer surface of the third die group 906 and having a third edge surface in contact with the upper surface 910 of the base die group along a third direction 932. The fourth die group 908 includes a fourth bonding member 941 disposed on the outer surface of the fourth die group 908 and having a fourth edge surface in contact with the upper surface 910 of the fifth die group 1 along a fourth direction 942. As can be seen, the first, second, third, and fourth directions 912, 922, 932, and 942 are arranged in a non-parallel manner relative to each other.

As can be seen, the example arrangement illustrated in FIG. 9A has individual dies in a given die group stacked in an orientation perpendicular to the individual dies in a die group next to it. For example, the dies in the die group 902 are stacked perpendicular to the dies in the die groups 904 and 906; the dies in the die group 904 are stacked perpendicular to the dies in the die groups 902 and 908; and so on as shown in this example. As mentioned, such a heterogeneous arrangement of die groups (in terms of the individual die orientation) can help reduce or prevent stress on the outer surface 910 of the base die group.

Figure 9B:
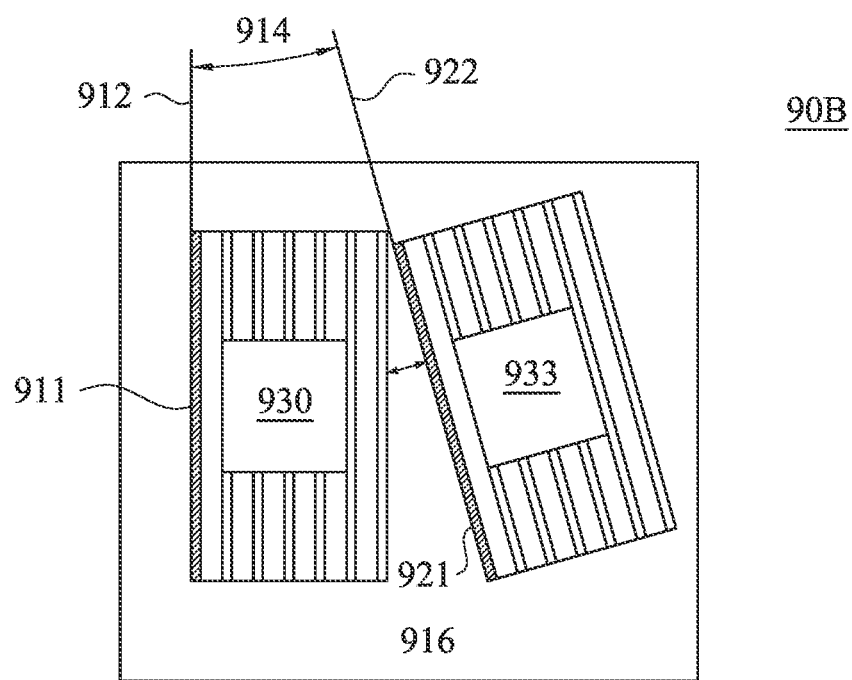
FIG. 9B is a top view of a 3D multi-die structure according to another exemplary embodiment.

FIG. 9B is a top view of a 3D multi-die structure 90B according to another exemplary embodiment. Referring to FIG. 9B, the die group 930 and die group 933 each includes bonding members having an edge surface in contact with an outer surface 916 of a base die group. In the example shown, the first die group 930 includes a first bonding member 911 having an edge surface contacting the outer surface 916 of the base die group along a first direction 912, and the second die group 933 includes a second bonding member 921 having an edge surface contacting the upper surface 916 of the base die group along a second direction 922. As can be seen, when projected onto the surface 916 of the base die group, the first and second directions 912 and 922 form an angle 914 that is greater than zero degree relative to each other. In some embodiments, the angle 914 between the die groups greater than 0.5 degree is sufficient to reduce stress accumulation and the risk of chip breakage or cracking in the bottom die group. In an exemplary embodiment, a non-parallel configuration or structure of the top die groups can prevent stress accumulation, thereby reducing the breakage or cracking risk of a die in the bottom die group.

Figure 9C:
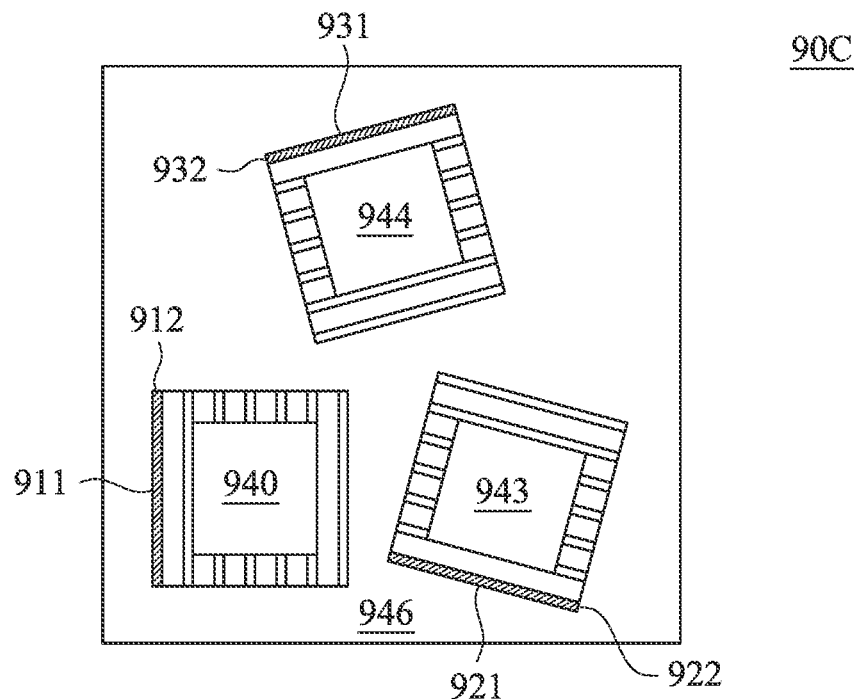
FIG. 9C is a top view of a 3D multi-die structure according to yet another exemplary embodiment.

FIG. 9C is a top view of a 3D multi-die structure 90C according to yet another exemplary embodiment. Referring to FIG. 9C, the 3D multi-die structure 90C includes a plurality of die groups, such as die group 940, die group 943 and die group 944 that are non-uniformly arranged on the main surface 946 of a base die group. The non-uniform or non-matrix arrangement of the top die groups prevents stress accumulation and reduces the risk of die breakage in the bottom die group. The non-uniform or non-matrix arrangement ensures that an angle formed between any two die groups is greater than zero degree. In the example shown, the first die group 940 includes a first bonding member 911 disposed on an outer surface of the first die group 940 and having a first edge surface in contact with the upper surface 946 of the base die group 1 along a first direction 912. The second die group 943 includes a second bonding member 921 disposed on an outer surface of the second die group 943 and having a second edge surface in contact with the upper surface 946 of the base die group along a second direction 922. The third die group 944 includes a third bonding member 931 disposed on an outer surface of the third die group and having a third edge surface in contact with the upper surface 946 of the base die group along a third direction 932. As can be seen, the first, second, and third directions 912, 922, 932 are arranged in a non-parallel manner relative to each other, i.e., the angle formed between them is greater than zero degree.

Figure 9D:
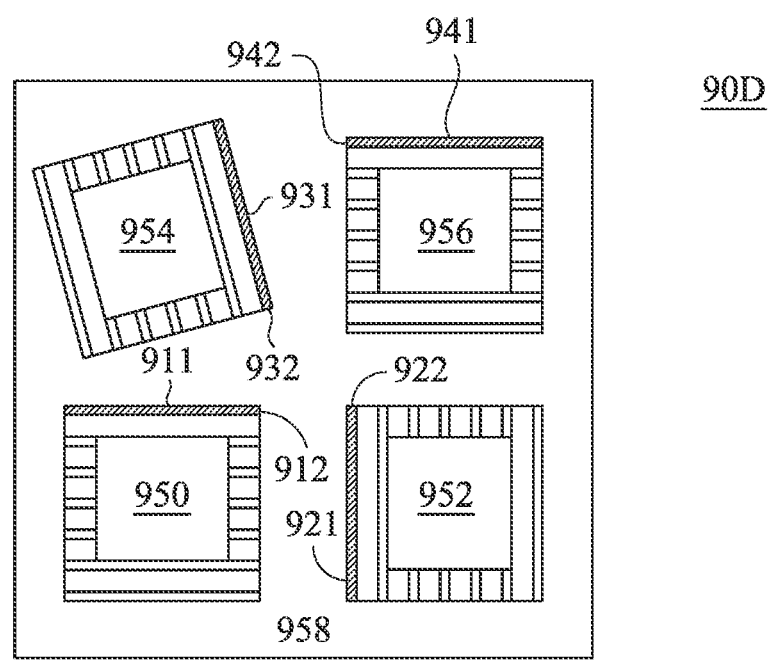
FIG. 9D is a top view of a 3D multi-die structure according to still another exemplary embodiment.

FIG. 9D is a top view of a 3D multi-die structure 90D according to still another exemplary embodiment. Referring to FIG. 9D, the 3D multi-die structure 90D includes a plurality of die groups, such as die groups 950, 952, 954, and 956 that are arranged in a non-parallel manner on the main surface 958 of a base die group. The non-parallel arrangement of the die groups prevents stress accumulation and reduces the risk of die breakage in the bottom die group. The non-parallel arrangement ensures that an angle formed between any two top die groups is greater than zero degree. In the example shown, the first die group 950 includes a first bonding member 911 disposed on the outer surface of the first top die group and having a first edge surface in contact with the outer surface 958 of the base die group along a first direction 912. The second die group 952 includes a second bonding member 921 disposed on the outer surface of the second die group 952 and having a second edge surface in contact with the outer surface 958 of the base die group 1 along a second direction 922. The third die group 954 includes a third bonding member 931 disposed on the outer surface of the third top die group and having a third edge surface in contact with the upper surface 958 of the base die group along a third direction 932. The fourth die group 956 includes a fourth bonding member 941 disposed on the outer surface of the fourth die group 956 and having a fourth edge surface in contact with the upper surface 958 of the base die group 1 along a fourth direction 942. As can be seen, the first, second, third, and fourth directions are arranged in a non-parallel manner relative to each other.

Figure 10:
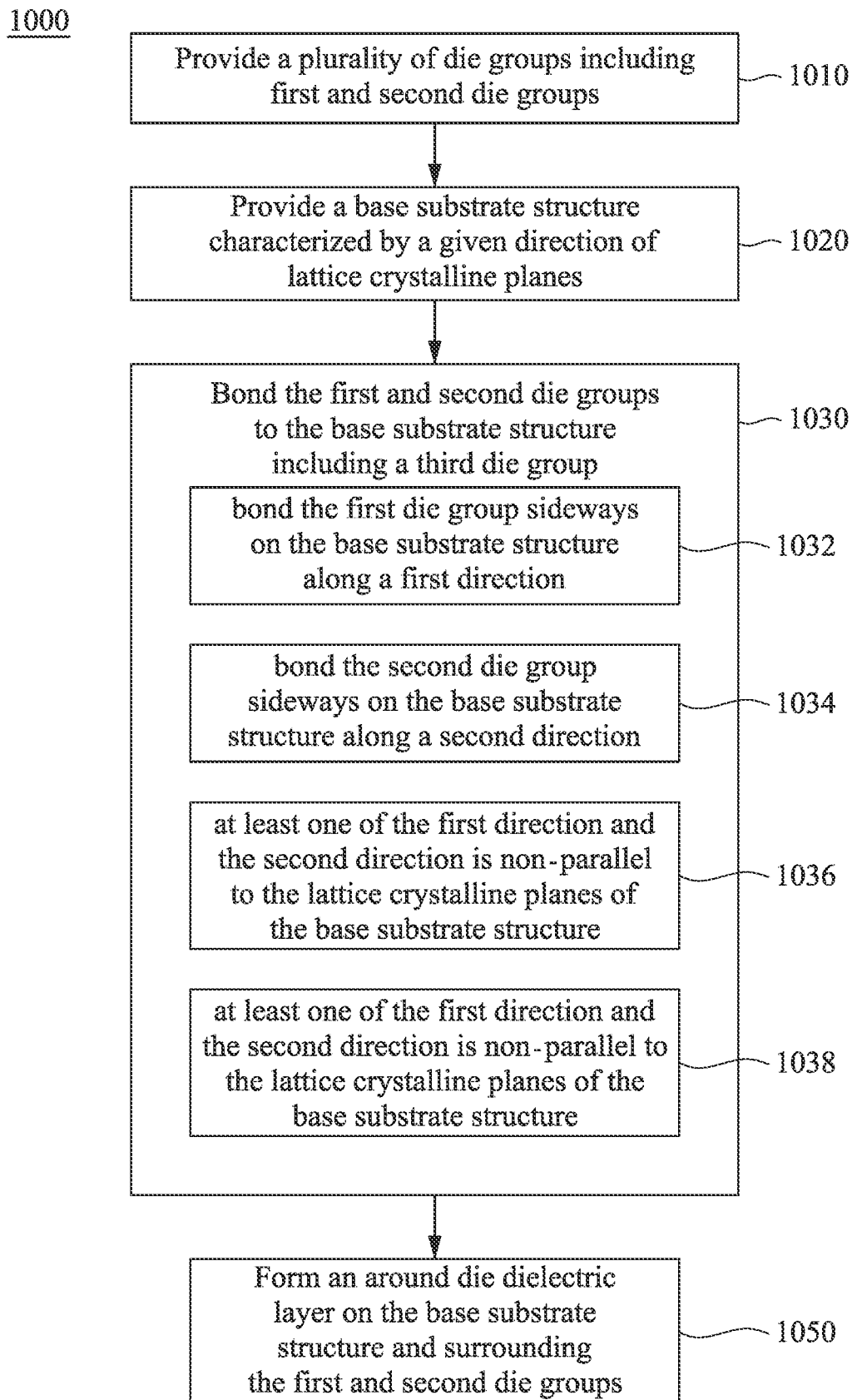
FIG. 10 is a simplified flowchart illustrating a method of forming a multi-die device, in accordance with some embodiments.

FIG. 10 is a simplified flowchart illustrating a method 1000 of forming a multi-die device according to an exemplary embodiment. Referring to FIG. 10, the method 1000 includes, at 1010, providing a plurality of die groups; each die group can include a plurality of dies stacked horizontally on top of each other, and each die can include a substrate, a plurality of dielectric layers on the substrate, and a plurality of metal lines and vias in the dielectric layers. Examples of the die groups are illustrated in connection with FIGS. 1-4B. Each die group also includes a bonding member disposed on an upper surface of the die group. In an embodiment, providing a plurality of die groups can include forming a plurality of wafers; each wafer can include a plurality of dies. The wafers are then bonded together and singulated to obtain the plurality of die groups. In an embodiment, a bonding layer (e.g., a passivation layer including an oxide material) can be formed on an upper surface of the bonded wafers before singulation, so that each of the singulated die groups includes a bonding member on its upper surface, and the bonding member has an edge surface that is substantially flush with a planar side surface of the die group. In some embodiments, the planar side surface is formed by polishing the edge of the die group to expose conductive structures for forming electrical contact at the edge of the dies. The planar side surface also includes dielectric regions for bonding.

In an embodiment, the plurality of die groups include a first die group and a second die group. The multi-die device also includes a base substrate structure. The method 1000 includes, at 1020, providing a base substrate structure characterized by a given direction of lattice crystalline planes, as described above in connection to FIGS. 6A and 6B. In an embodiment, the base substrate structure can include a third die group that functions as a support substrate. In other cases, the base substrate structure can include an interposer, a carrier substrate, etc. The base substrate structure can be similar to the examples of the die groups illustrated in connection with FIGS. 1-4B. The base substrate structure has a first dimension (e.g., a horizontal surface area or main surface area) greater than a total second dimension (e.g., a sum of all side surface areas in a vertical direction) of the first and second die groups, so that the first and second die groups can be coupled to a main surface of the bonding layer of the third die group on their side surface, i.e., the bonding layer on the third die group has a surface area greater than the sum of all side surface areas of the first and second die groups that are in contact with the bonding layer on the third die group. In an embodiment, the bonding layer on the third die group is a hybrid bonding member including a dielectric material and a plurality of conductive pads that are electrically isolated by the dielectric material and include an upper surface substantially coplanar or flush with an upper surface of the dielectric material. In an embodiment, the dielectric material includes an oxide material.

At 1030, the method 1000 includes vertically (perpendicularly) bonding a side edge surface of the first and second die groups to the main surface of the base substrate structure. At 1032, the first die group is bonded sideways on the base substrate structure along a first direction. At 1034, the second die group is bonded sideways on the base substrate structure along a second direction. Examples of sideway bonding are described above in connection with FIGS. 4A-4B and FIGS. 5A-5B. At 1036, at least one of the first direction and the second direction is non-parallel to the lattice crystalline planes of the base substrate structure. Examples of this arrangement are described in connection with FIGS. 6A-6B, 7, and 8. At 1038, the first direction and the second direction are non-parallel to each other. Examples of this arrangement are described in connection with FIGS. 9A-9D. Further details of the processes in method 1000 are described above in connection to FIGS. 1-9D.

In an embodiment, the coupling is performed by an oxide-to-oxide bonding. In an embodiment, the coupling is performed by a hybrid bonding including an oxide-to-oxide bonding between the bonding members of the first and second die groups and the bonding layer of the base substrate structure and a metal-to-metal bonding between a connection member of the first and second die groups and a bonding pad of the base substrate structure as shown in FIGS. 4A and 4B. The first and second die groups are bonded on the top surface of the base substrate structure in a non-parallel arrangement with the lattice crystalline planes of the base substrate structure. For example, the first or second die group is aligned at an angle greater than zero degree to the lattice crystalline plane of the base substrate structure. FIGS. 6A, 6B, 7, 8 and 9A-9D show some exemplary arrangements of the first and second die groups on the base substrate structure. By arranging the first and/or second die groups at an angle greater than zero degree with the lattice crystalline planes of the base substrate structure, warpage, cracking, or breakage of the package can be reduced or eliminated. Further reduction of warpage, cracking, or breakage of the package can be achieved by non-parallel arrangement of the top die groups. In some embodiments, at least one of the top die groups is aligned at an angle greater than zero degree to another one of the top die group.

At 1050, the method 1000 includes forming an around die dielectric layer or an encapsulation compound on the base substrate structure and surrounding the first and second die groups after the first and second die groups have been coupled to the base substrate structure. The around die dielectric layer includes TEOS or silicon oxide.

In some embodiments, a multi-die structure includes a first die group having a first bonding member with a first side surface aligned with a side surface of the first die group, a second die group having a second bonding member with a second side surface aligned with a side surface of the second die group, and a third die group having a third bonding member on the third die group. The first and second die groups are disposed on the third bonding member with the first side surface and the second side surface in contact with the third bonding member. An angle between the first and second side surfaces is greater than zero degree. In an embodiment, the third bonding member includes a bonding pad structure having one or more bonding pads, and a dielectric layer isolating the one or more bonding pads. The first die group includes a first connection member on the side surface of the first die group and in contact with the bonding pad structure.

Some embodiments provide a three-dimensional (3D) functional block die stacking solution to enhance high system integration and performance. In those embodiments, multiple functional stacked die devices, having the same or different functionalities, are grouped together as a die group. In those embodiments, multiple die groups are arranged in a multi-die structure in which the top die groups are disposed sideways on a base substrate structure. The base substrate structure can include another die group or a support substrate, a carrier substrate, an interposer, etc. The edges of the top die groups are bonded to the base substrate structure to provide mechanical bonding electrical connection. In some embodiments, the top die groups are aligned at an angle greater than zero with respect to crystalline lattice directions of the base substrate structure to avoid stress buildup along crystalline lattice planes where the substrate is susceptible to cracking or breakage. In devices and methods described below, stresses in a substrate of the multi-die structure are eliminated or reduced. Arrangements of die groups in a multi-die structure can prevent die breaking, die cracking, and warpage of the substrate. Furthermore, increased electrical connections can be provided at the die edges. Moreover, the back surface of an edge die of the die group can provide more coupling space to form electrical, mechanical, or optical connections to external devices.

In some embodiments, a semiconductor package is provided. The semiconductor package includes: a base substrate structure; and a plurality of die groups disposed on a top surface of the based substrate structure, the plurality of die groups comprising a first die group and a second die group, the second die group being a neighboring die group of the first die group. The first die group includes a plurality of first dies stacked parallel to each other and parallel to a front surface of the first die group, the front surface of the first die group and the top surface of the base substrate structure intersect at a first edge, and the first edge extends in a first direction in the top surface of the base substrate structure. The second die group includes a plurality of second dies stacked parallel to each other and parallel to a front surface of the second die group, the front surface of the second die group and the top surface of the base substrate structure intersect at a second edge, the second edge extends in a second direction in the top surface of the base substrate structure. The first direction is not parallel to the second direction.

In some embodiments, a multi-die structure is provided. The multi-die structure includes: a base substrate structure having a top surface; and a plurality of die groups disposed on the top surface of the based substrate structure, the plurality of die groups comprising: a first die group comprising a plurality of first dies stacked parallel to each other and parallel to a front surface of the first die group, wherein the front surface of the first die group and the top surface of the base substrate structure intersect at a first edge, and the first edge extends in a first direction in the top surface of the base substrate structure; and a second die group comprising a plurality of second dies stacked parallel to each other and parallel to a front surface of the second die group, wherein the front surface of the second die group and the top surface of the base substrate structure intersect at a second edge, the second edge extends in a second direction in the top surface of the base substrate structure. The second die group is a neighboring die group of the first die group, and the first direction is not parallel to the second direction.

In some embodiments, a semiconductor package is provided. The semiconductor package includes: a base substrate structure having a top surface; and a plurality of die groups disposed on the top surface of the based substrate structure, the plurality of die groups comprising: a first die group comprising a plurality of first dies stacked parallel to each other and parallel to a front surface of the first die group, wherein the front surface of the first die group and the top surface of the base substrate structure intersect at a first edge, and the first edge extends in a first direction in the top surface of the base substrate structure; a second die group comprising a plurality of second dies stacked parallel to each other and parallel to a front surface of the second die group, wherein the front surface of the second die group and the top surface of the base substrate structure intersect at a second edge, the second edge extends in a second direction in the top surface of the base substrate structure; a third die group comprising a plurality of third dies stacked parallel to each other and parallel to a front surface of the third die group, the front surface of the third die group and the top surface of the base substrate structure intersect at a third edge, and the third edge extends in a third direction in the top surface of the base substrate structure; and a fourth die group includes a plurality of fourth dies stacked parallel to each other and parallel to a front surface of the fourth die group, the front surface of the fourth die group and the top surface of the base substrate structure intersect at a fourth edge, and the fourth edge extends in a fourth direction in the top surface of the base substrate structure. The first die group and the second die group are disposed in a first row, the third die group and the fourth die group are disposed in a second row, the first die group and the third die group are disposed in a first column, and the second die group and the fourth die group are disposed in a second column. The second die group is a neighboring die group of the first die group, and the first direction is not parallel to the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a base substrate structure; and
a plurality of die groups disposed on a top surface of the based substrate structure, the plurality of die groups comprising a first die group and a second die group, the second die group being a neighboring die group of the first die group;
wherein the first die group includes a plurality of first dies stacked parallel to each other and parallel to a front surface of the first die group, the front surface of the first die group and the top surface of the base substrate structure intersect at a first edge, and the first edge extends in a first direction in the top surface of the base substrate structure;

wherein the second die group includes a plurality of second dies stacked parallel to each other and parallel to a front surface of the second die group, the front surface of the second die group and the top surface of the base substrate structure intersect at a second edge, the second edge extends in a second direction in the top surface of the base substrate structure; and wherein the first direction is not parallel to the second direction.

2. The semiconductor package of claim 1, wherein the first direction and the second direction define an angle, and the angle is larger than 0.5 degrees.

3. The semiconductor package of claim 1, wherein the first direction and the second direction define an angle, and the angle is substantially equal to 90 degrees.

4. The semiconductor package of claim 1, wherein the first die group comprises a first bonding member, and the first die group is bonded to a first bonding pad disposed on the top surface of the base substrate structure through the first bonding member.

5. The semiconductor package of claim 4, wherein the first die group is bonded to the first bonding pad using hybrid bonding.

6. The semiconductor package of claim 1, wherein the second die group comprises a second bonding member, and the second die group is bonded to a second bonding pad disposed on the top surface of the base substrate structure through the second bonding member.

7. The semiconductor package of claim 6, wherein the second die group is bonded to the second bonding pad using hybrid bonding.

8. The semiconductor package of claim 1, wherein the plurality of die groups further comprises a third die group; and
wherein the third die group includes a plurality of third dies stacked parallel to each other and parallel to a front surface of the third die group, the front surface of the third die group and the top surface of the base substrate structure intersect at a third edge, and the third edge extends in a third direction in the top surface of the base substrate structure.

9. The semiconductor package of claim 8, wherein the first die group is a neighboring die group of the third die group, and the first direction is not parallel to the third direction.

10. The semiconductor package of claim 9, wherein the third direction and the first direction define an angle, and the angle is larger than 0.5 degrees.

11. The semiconductor package of claim 9, wherein the third direction and the first direction define an angle, and the angle is substantially equal to 90 degrees.

12. The semiconductor package of claim 9, wherein the plurality of die groups further comprises a fourth die group; and
wherein the fourth die group includes a plurality of fourth dies stacked parallel to each other and parallel to a front surface of the fourth die group, the front surface of the fourth die group and the top surface of the base substrate structure intersect at a fourth edge, and the fourth edge extends in a fourth direction in the top surface of the base substrate structure.

13. The semiconductor package of claim 12, wherein the third die group is a neighboring die group of the fourth die group, and the fourth direction is not parallel to the third direction.

14. The semiconductor package of claim 13, wherein the first die group and the second die group are disposed in a first row, the third die group and the fourth die group are disposed in a second row, the first die group and the third die group are disposed in a first column, and the second die group and the fourth die group are disposed in a second column.

15. The semiconductor package of claim 14, wherein the first direction is perpendicular to the second direction and the third direction, and the fourth direction is perpendicular to the second direction and the third direction.

16. A multi-die structure, comprising:
  a base substrate structure having a top surface; and
  a plurality of die groups disposed on the top surface of the based substrate structure, the plurality of die groups comprising:
    a first die group comprising a plurality of first dies stacked parallel to each other and parallel to a front surface of the first die group, wherein the front surface of the first die group and the top surface of the base substrate structure intersect at a first edge, and the first edge extends in a first direction in the top surface of the base substrate structure; and
    a second die group comprising a plurality of second dies stacked parallel to each other and parallel to a front surface of the second die group, wherein the front surface of the second die group and the top surface of the base substrate structure intersect at a second edge, the second edge extends in a second direction in the top surface of the base substrate structure; and
  wherein the second die group is a neighboring die group of the first die group, and the first direction is not parallel to the second direction.

17. The multi-die structure of claim 16, wherein the first direction and the second direction define an angle, and the angle is larger than 0.5 degrees.

18. The multi-die structure of claim 16, wherein the first direction and the second direction define an angle, and the angle is substantially equal to 90 degrees.

19. A semiconductor package, comprising:
  a base substrate structure having a top surface; and
  a plurality of die groups disposed on the top surface of the based substrate structure, the plurality of die groups comprising:
    a first die group comprising a plurality of first dies stacked parallel to each other and parallel to a front surface of the first die group, wherein the front surface of the first die group and the top surface of the base substrate structure intersect at a first edge, and the first edge extends in a first direction in the top surface of the base substrate structure;
    a second die group comprising a plurality of second dies stacked parallel to each other and parallel to a front surface of the second die group, wherein the front surface of the second die group and the top surface of the base substrate structure intersect at a second edge, the second edge extends in a second direction in the top surface of the base substrate structure;
    a third die group comprising a plurality of third dies stacked parallel to each other and parallel to a front surface of the third die group, the front surface of the third die group and the top surface of the base substrate structure intersect at a third edge, and the third edge extends in a third direction in the top surface of the base substrate structure; and
    a fourth die group includes a plurality of fourth dies stacked parallel to each other and parallel to a front surface of the fourth die group, the front surface of the fourth die group and the top surface of the base substrate structure intersect at a fourth edge, and the fourth edge extends in a fourth direction in the top surface of the base substrate structure; and
  wherein the first die group and the second die group are disposed in a first row, the third die group and the fourth die group are disposed in a second row, the first die group and the third die group are disposed in a first column, and the second die group and the fourth die group are disposed in a second column; and
  wherein the second die group is a neighboring die group of the first die group, and the first direction is not parallel to the second direction.

20. The semiconductor package of claim 19, wherein the first direction is perpendicular to the second direction and the third direction, and the fourth direction is perpendicular to the second direction and the third direction.

* * * * *